(12) United States Patent
Lee et al.

(10) Patent No.: US 12,414,287 B2
(45) Date of Patent: Sep. 9, 2025

(54) METHOD OF FABRICATING SEMICONDUCTOR DEVICE

(71) Applicant: Samsung Electronics Co., Ltd., Suwon-si (KR)

(72) Inventors: Yuna Lee, Hwaseong-si (KR); Sangwuk Park, Hwaseong-si (KR); Hyunchul Yoon, Seongnam-si (KR); Seungjae Lee, Seoul (KR); Joonkyu Rhee, Hwaseong-si (KR); Chanmin Lee, Hwaseong-si (KR); Jungpyo Hong, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 347 days.

(21) Appl. No.: 18/088,370

(22) Filed: Dec. 23, 2022

(65) Prior Publication Data

US 2023/0209802 A1    Jun. 29, 2023

(30) Foreign Application Priority Data

Dec. 28, 2021  (KR) .................. 10-2021-0189553

(51) Int. Cl.
  *H10B 12/00*  (2023.01)
(52) U.S. Cl.
  CPC ........... *H10B 12/09* (2023.02); *H10B 12/482* (2023.02); *H10B 12/50* (2023.02)
(58) Field of Classification Search
  CPC ....... H10B 12/09; H10B 12/482; H10B 12/50
  See application file for complete search history.

(56) References Cited

U.S. PATENT DOCUMENTS

| 7,550,363 | B2 * | 6/2009 | Lee .................. H01L 21/76229 |
| | | | 438/424 |
| 8,551,877 | B2 | 10/2013 | Ranjan et al. |
| 9,653,321 | B2 | 5/2017 | Mikami |
| 10,186,597 | B2 | 1/2019 | Ahn et al. |
| 11,011,521 | B2 | 5/2021 | Korkmaz et al. |
| 2009/0023277 | A1 * | 1/2009 | Kang .................. H10D 64/027 |
| | | | 257/E21.177 |

(Continued)

FOREIGN PATENT DOCUMENTS

| KR | 1020130102505 A | 9/2013 |
| KR | 1020150043978 A | 4/2015 |
| TW | 202109835 A | 3/2021 |

*Primary Examiner* — Richard A Booth
(74) *Attorney, Agent, or Firm* — Muir Patent Law, PLLC

(57) ABSTRACT

A method of fabricating a semiconductor device includes forming an insulating layer and a peripheral structure on first and second regions of the substrate, forming first and second mask layers on the insulating layer and the peripheral structure, patterning the first and second mask layers to form first and second mask structures on the first and second regions, etching the insulating layer using the first and second mask structures as an etching mask, to form insulating patterns, forming a sacrificial layer in spaces between two adjacent insulating patterns on the first region, removing the second mask pattern on the first region by a dry etching process, forming an anti-oxidation layer on a surface of the second mask layer on the second region after removing the second mask pattern on the first region, and removing the second mask layer with the anti-oxidation layer by a wet etching process.

20 Claims, 37 Drawing Sheets

(56) References Cited

U.S. PATENT DOCUMENTS

| | | |
|---|---|---|
| 2014/0264672 A1 | 9/2014 | Park et al. |
| 2018/0166529 A1* | 6/2018 | Park et al. |
| 2019/0103302 A1* | 4/2019 | Yoon ................ H01L 21/76895 |
| 2019/0348418 A1 | 11/2019 | Hwang et al. |
| 2020/0312852 A1 | 10/2020 | Ryu et al. |
| 2021/0057339 A1 | 2/2021 | Lee et al. |
| 2021/0066303 A1 | 3/2021 | Huang |
| 2021/0125998 A1 | 4/2021 | Kim et al. |
| 2021/0151439 A1 | 5/2021 | Choi et al. |
| 2021/0272961 A1 | 9/2021 | Tung et al. |

* cited by examiner

METHOD OF FABRICATING SEMICONDUCTOR DEVICE

CROSS-REFERENCE TO RELATED APPLICATION(S)

This application claims benefit of priority to Korean Patent Application No. 10-2021-0189553 filed on Dec. 28, 2021 in the Korean Intellectual Property Office, the disclosure of which is incorporated by reference herein in its entirety.

BACKGROUND

The present disclosure relates to a method of fabricating a semiconductor device, including a method of patterning a material layer using at least two mask layers, and a semiconductor device fabricated by the same.

Research on reductions of sizes of elements, constituting a semiconductor device, and improvements in performance thereof has been conducted. For example, research on reliable and stable formation of elements, having reduced sizes, in a dynamic random access memory (DRAM) has been conducted.

SUMMARY

Example embodiments provide a method of fabricating a semiconductor device, including a method of stably patterning a material layer using at least two mask layers.

Example embodiments provide a semiconductor device fabricated by the above-described method.

According to an example embodiment, a method of fabricating a semiconductor device includes forming a plurality of bitline structures on a first region of a substrate, forming a peripheral device structure on a second region, adjacent to the first region, of the substrate, forming an insulating layer in spaces between two adjacent bitline structures of the plurality of bitline structures, forming a first mask layer and a second mask layer sequentially on the insulating layer, the bitline structures, and the peripheral device structure, patterning the first and second mask layers to form a first mask structure including a first mask pattern and a second mask pattern sequentially stacked on the first region, and a second mask structure including the first and second mask layers remaining, after the patterning of the first and second mask layers, on the second region, etching the insulating layer by an etching process using the first and second mask structures as an etching mask, to form a plurality of insulating patterns in spaces between two adjacent bitline structures of the plurality of bitline structures, forming a sacrificial layer to fill spaces between two adjacent insulating patterns of the plurality of insulating patterns on the first region, removing the second mask pattern on the first region by performing a dry etching process, forming an anti-oxidation layer on a surface of the second mask layer on the second region after removing the second mask pattern on the first region, removing the second mask layer, having a surface on which the anti-oxidation layer is formed, by performing a wet etching process, removing the sacrificial layer to form a plurality of fence holes after selectively removing the second mask layer on which the anti-oxidation layer is formed, forming a plurality of insulating fences in the plurality of fence holes, respectively, removing the first mask pattern and the plurality of insulating patterns to form a plurality of contact holes, and forming a plurality of contact plugs in the plurality of contact holes, respectively.

According to an example embodiment, a method of fabricating a semiconductor device includes forming an insulating layer on a first region of a substrate and a peripheral structure on a second region of the substrate, forming a first mask layer and a second mask layer sequentially on the insulating layer and the peripheral structure, patterning the first and second mask layers to form a first mask structure including a first mask pattern and a second mask pattern sequentially stacked on the first region, and a second mask structure including the first and second mask layers remaining, after the patterning of the first and second mask layers, on the second region, etching the insulating layer by an etching process using the first and second mask structures as an etching mask, to form a plurality of insulating patterns separated apart from each other, forming a sacrificial layer in spaces between two adjacent insulating patterns of the plurality of insulating patterns, on the first region, removing the second mask pattern on the first region by performing a dry etching process, forming an anti-oxidation layer on a surface of the second mask layer on the second region after removing the second mask pattern on the first region, and removing the second mask layer, having a surface on which the anti-oxidation layer is formed, by performing a wet etching process.

According to an example embodiment, a method of fabricating a semiconductor device includes forming a cell transistor at a first region of a substrate, forming a plurality of bitline structures and a peripheral device structure on the substrate, the plurality of bitline structures being formed on the first region and the peripheral device structure being formed on a second region, adjacent to the first region, of the substrate, forming an insulating layer between spaces between two adjacent bitline structures of the plurality of bitline structures, forming a first mask layer and a second mask layer sequentially on the insulating layer, the plurality of bitline structures, and the peripheral device structure, patterning the first and second mask layers to form a first mask structure including a first mask pattern and a second mask pattern sequentially stacked on the first region, and a second mask structure including the first and second mask layers remaining, after the patterning of the first and second mask layers, on the second region, etching the insulating layer by an etching process, using the first and second mask structures as an etching mask, to form a plurality of insulating patterns, each insulating pattern of the plurality of insulating patterns being disposed between corresponding two adjacent bitline structures of the plurality of bitline structures, forming a sacrificial layer to fill spaces between two adjacent insulating patterns of the plurality of insulating patterns, on the first region, removing the second mask pattern by performing a dry etching process, forming an anti-oxidation layer on a surface of the second mask layer on the second region after removing the second mask pattern, and removing the second mask layer, having a surface on which the anti-oxidation layer is formed, by performing a wet etching process.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, terms such as "upper," "intermediate," and "lower" may be replaced with other terms, for example, "first," "second," and "third" to describe components of the present specification. The terms such as "first," "second," and "third" may be used to describe various components, but the components may not be restricted by the terms, and "first component" may be referred to as "second component."

Hereinafter, methods of fabricating a semiconductor device according to example embodiments and structures of a semiconductor device, fabricated by the methods, will be described.

Figure 1A:
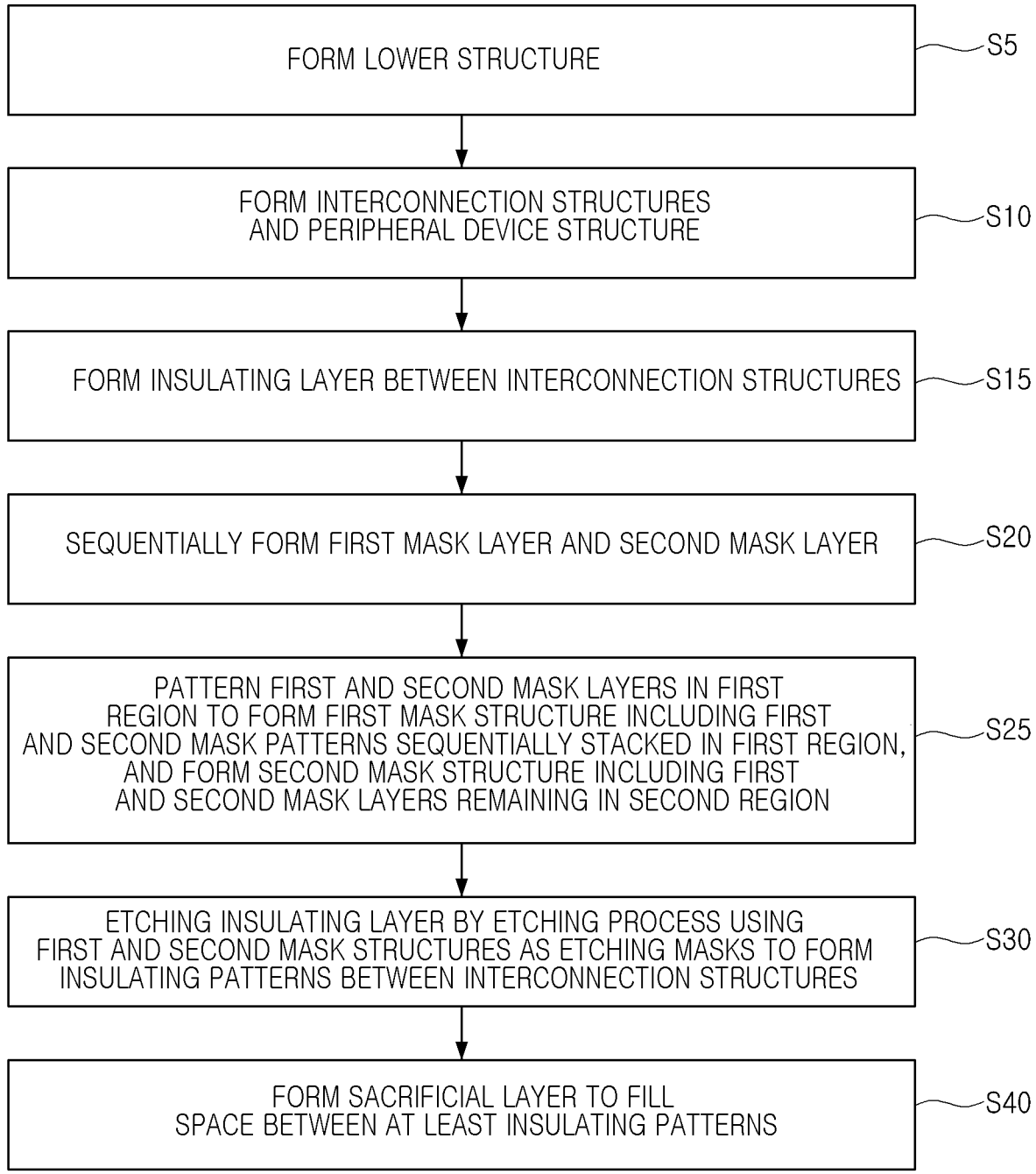
FIGS. 1A and 1B are process flow diagrams illustrating an example of a method of fabricating a semiconductor device according to an example embodiment.
Figure 1B:
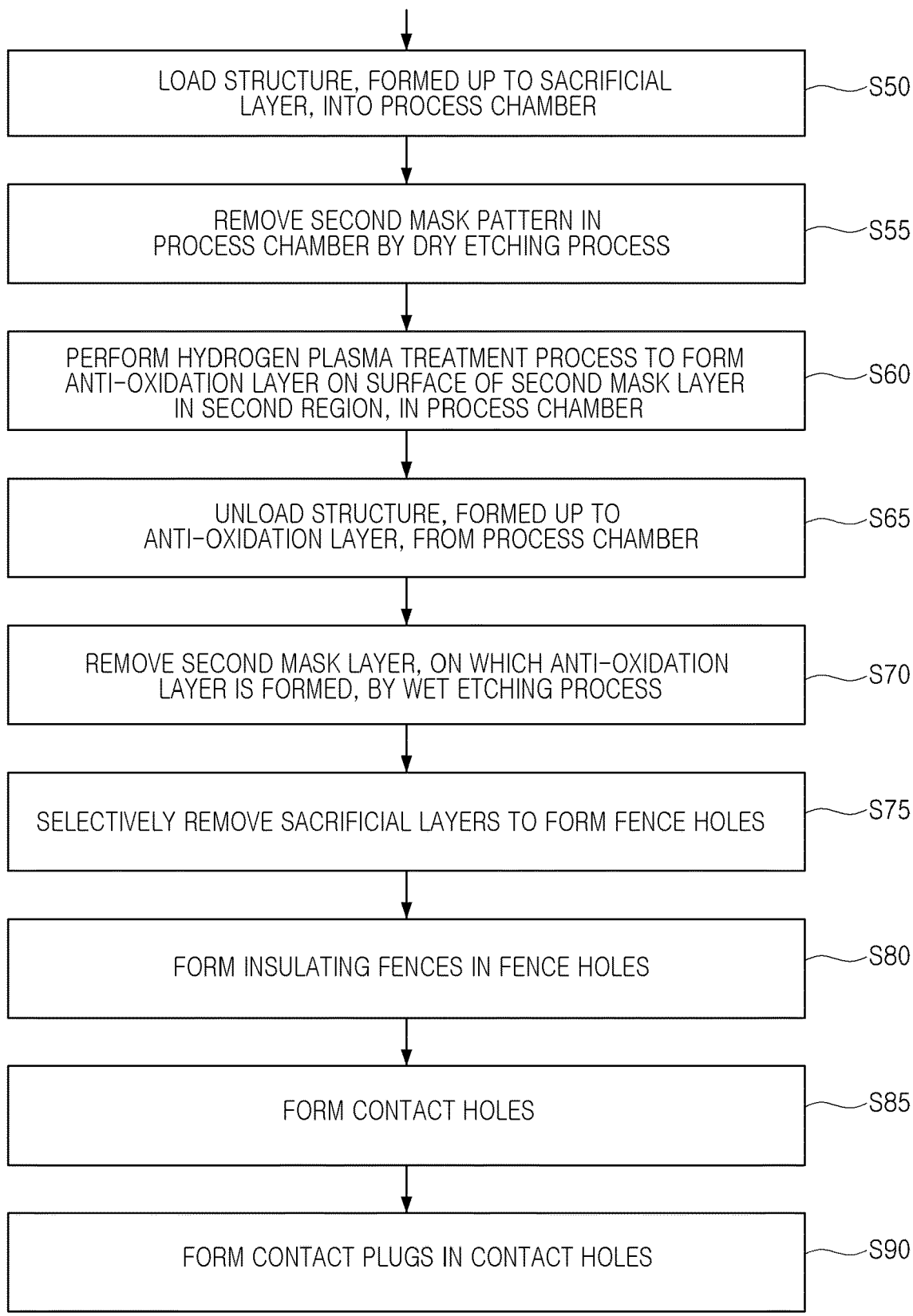
Figure 2:
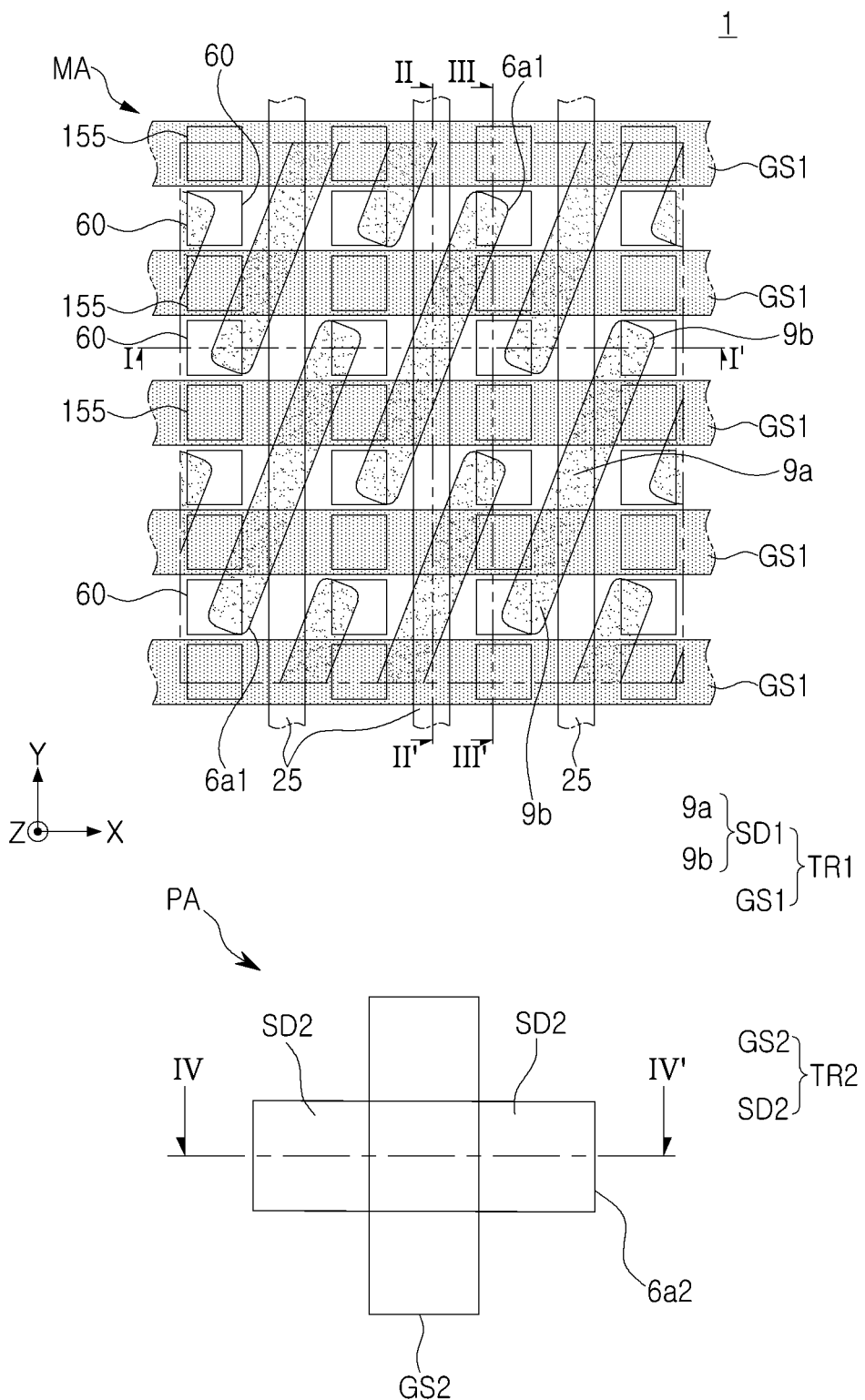
FIG. 2 is a plan view illustrating an example of a method of fabricating a semiconductor device according to an example embodiment.
Figure 3A:
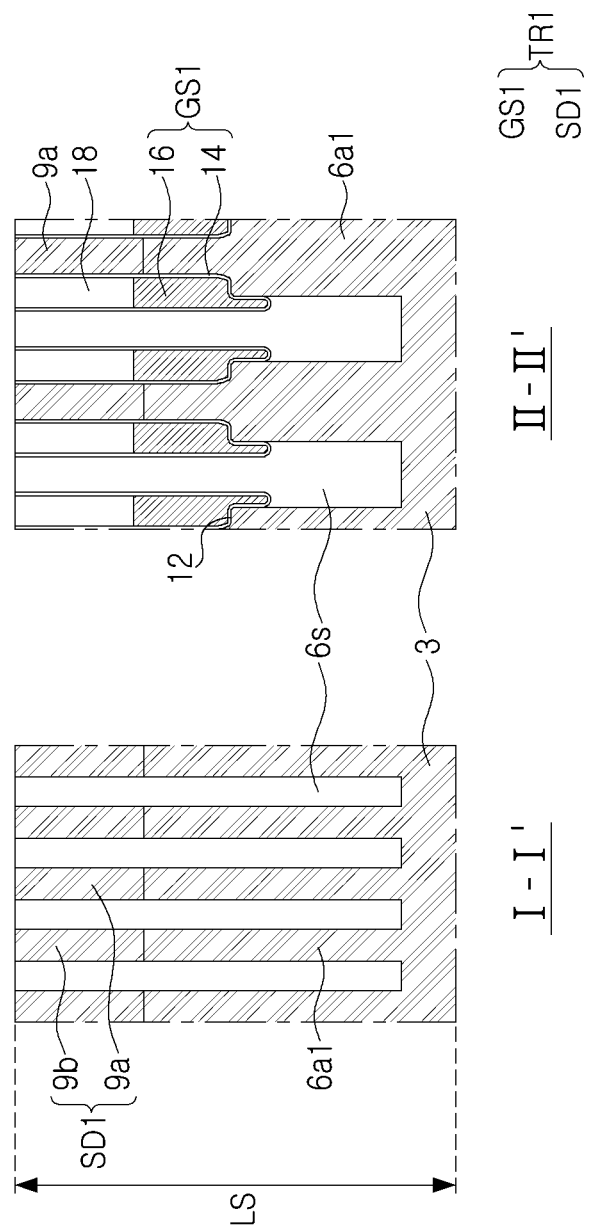
FIGS. 3A, 3B, 4A, 4B, 5A, 5B, 6A, 6B, 7A, 7B, 8A, 8B, 9A, 9B, 10, 11A, 11B, 12A, 12B, 13A and 13B are cross-sectional views illustrating a method of fabricating a semiconductor device according to an example embodiment.
Figure 3B:
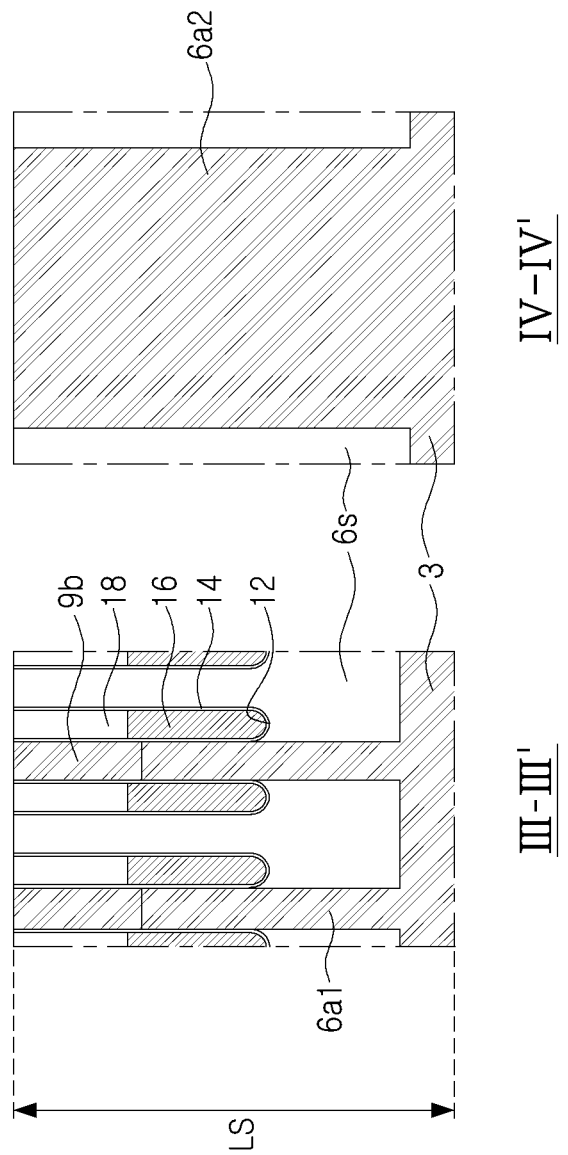
Figure 4A:
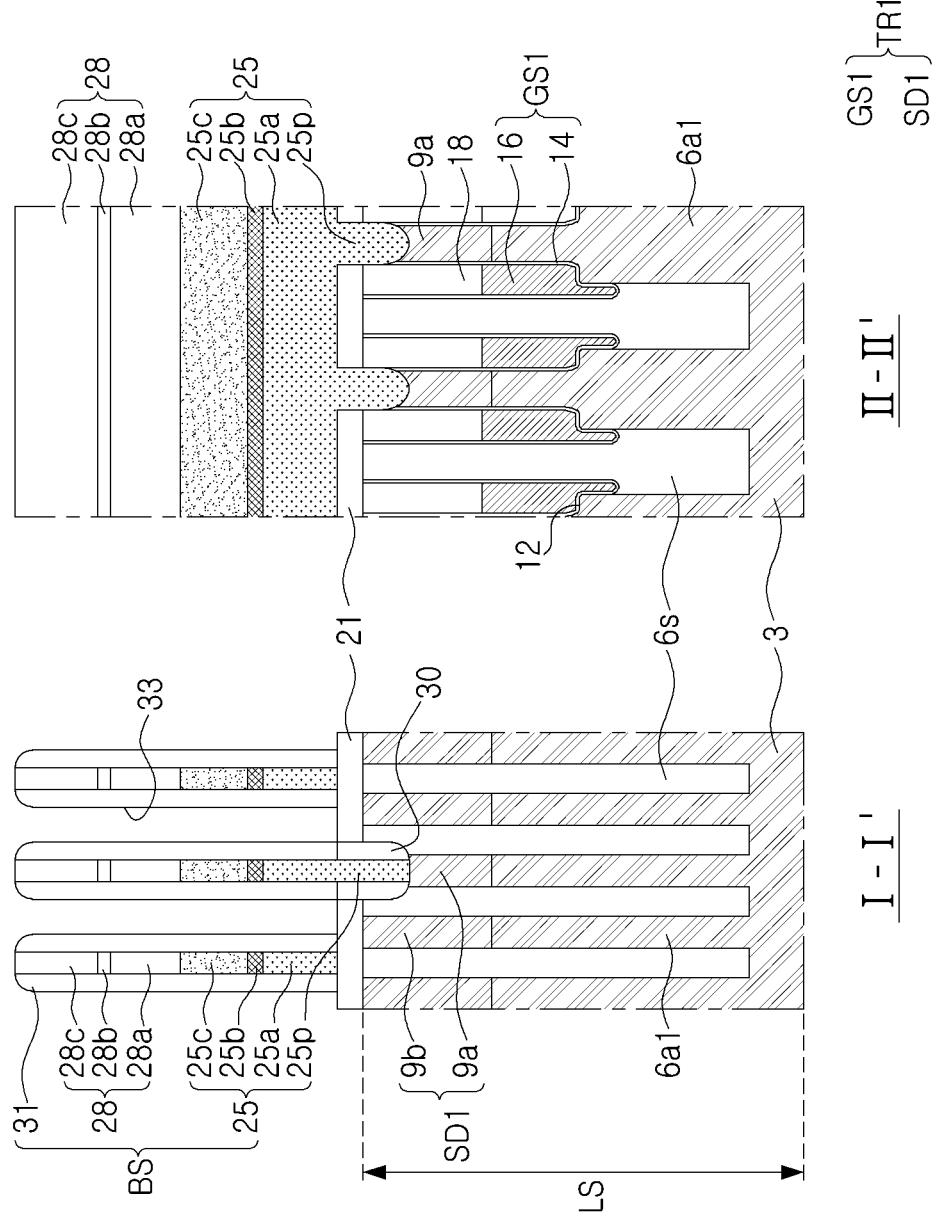
Figure 4B:
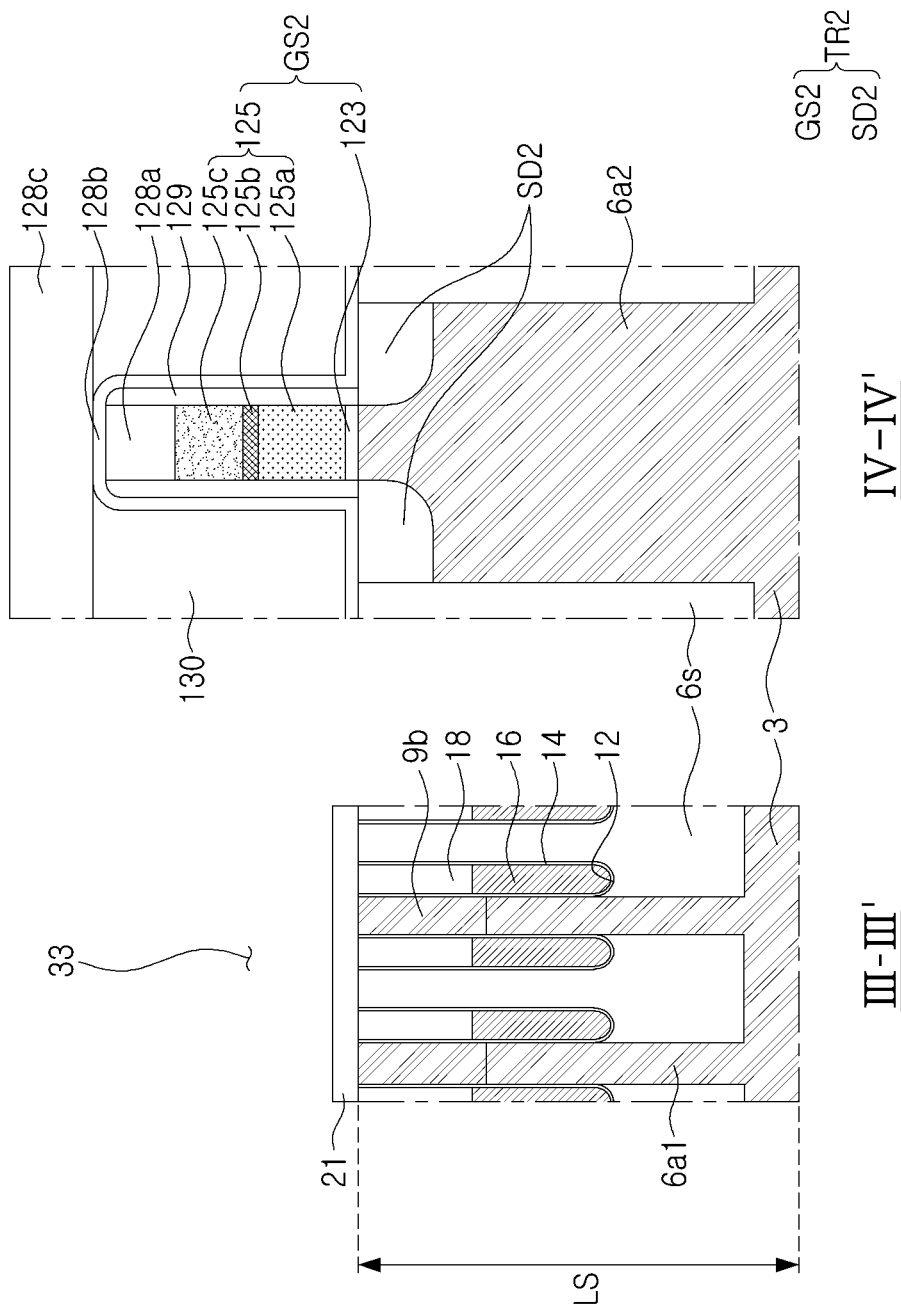

A method of fabricating a semiconductor device according to an example embodiment and a structure of a semiconductor device fabricated by the method will be described with reference to FIGS. 1A to 13B. FIGS. 1A and 1B are process flow diagrams illustrating an example of a method of fabricating a semiconductor device according to an example embodiment, FIG. 2 is a plan view illustrating an example of a method of fabricating a semiconductor device according to an example embodiment, and FIGS. 3A to 13B are cross-sectional views illustrating a method of fabricating a semiconductor device according to an example embodiment. In FIGS. 3A to 13B, FIGS. 3A, 4A, 5A, 6A, 7A, 8A, 9A, 11A, 12A, and 13A are cross-sectional views illustrating regions taken along lines I-I' and II-II' of FIG. 2, and FIGS. 3B, 4B, 5B, 6B, 7B, 8B, 9B, 10, 11B, 12B, and 13B are cross-sectional views illustrating regions taken along lines and IV-IV' of FIG. 2.

Referring to FIGS. 1A, 2, 3A, and 3B, in operation S5, a lower structure LS may be formed. The forming of the lower structure LS may include forming a device isolation layer 6s on a semiconductor substrate 3 to define cell active regions 6a1 and a peripheral active region 6a2, forming gate trenches 12 to intersect the cell active region 6a1 and to extend inwardly of the device isolation layer 6s, and forming cell gate structures GS1 to respectively fill the gate trenches 12 and cell gate capping layers 18 on the cell gate structures GS1.

The semiconductor substrate 3 may be formed of a semiconductor material such as silicon.

Each of the cell gate structures GS1 may include a cell gate dielectric layer 14, conformally covering an internal wall of the gate trench 12, and a cell gate electrode 16 filling a portion of the gate trench 12 on the cell gate dielectric layer 14.

The forming of the lower structure LS may further include forming a gate capping layer 18 to fill a remaining portion of the gate trench 12 on the gate electrode 16.

The gate electrode 16 may include or may be formed of doped polysilicon, metal, a conductive metal nitride, a metal-semiconductor compound, a conductive metal oxide, graphene, carbon nanotubes, or combinations thereof. For example, the gate electrode 16 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, graphene, carbon nanotubes, or combinations thereof, but example embodiments are not limited thereto. The gate electrode 16 may be a single layer or multiple layers of the above-mentioned materials. For example, the gate electrode 16 may include a first electrode layer, which may be formed of a metal material, and a second electrode layer which may be formed of doped polysilicon on the first electrode layer. The gate capping layer 18 may include or may be formed of an insulating material, for example, silicon nitride.

The forming of the lower structure LS may further include forming cell sources/drains SD1, including a first impurity region 9a and a second impurity region 9b, at the cell active regions 6a1 using an ion implantation process.

The cell gate structure GS1 and the cell sources/drains SD1 may constitute cell transistors TR1.

In an embodiment, the cell source/drain regions SD1 may be formed before the device isolation layer 6s is formed.

In an embodiment, the cell source/drain regions SD1 may be formed after the device isolation layer 6s is formed and before the gate trenches 12 are formed.

In an embodiment, the cell source/drain regions SD1 may be formed after the cell gate structures GS1 and the cell gate capping layer 18 are formed.

The cell active regions 6a1 may be formed of single-crystalline silicon. The cell active regions 6a1 may have P-type conductivity, and the first and second impurity regions 9a and 9b may have N-type conductivity.

The lower structure LS may be formed in a first region MA and a second region PA. When the semiconductor device 1 according to example embodiments is a memory device (for example, a DRAM device), the first region MA may be a memory cell array region and the second region PA may be a peripheral circuit region around the memory cell array region.

In example embodiments, the first region MA may be referred to as a memory cell array region or a memory region, and the second region PA may be referred to as a peripheral circuit region or a peripheral region.

Referring to FIGS. 1A, 2, 4A, and 4B, a buffer insulating layer 21 may be formed on the lower structure LS in the first region MA. In an embodiment, the buffer insulating layer 21 may not be formed on the lower structure LS in the second region PA. The buffer insulating layer 21 may include at least a silicon oxide layer and a silicon nitride layer sequentially stacked.

In operation S10, interconnection structures BS and peripheral device structures TR2, 130, 128a, 128b, 128c, and 129 may be formed. The interconnection structures BS and the peripheral device structures TR2, 130, 128a, 128b, 128c, and 129 may be formed on the lower structure LS. A portion of the interconnection structures BS and a portion of the peripheral device structures TR2, 130, 128a, 128b, 128c and 129 may be simultaneously formed.

The peripheral device structures TR2, 130, 128a, 128b, 128c, and 129 may be referred to as peripheral structures.

A line-shaped opening 33 may be formed between the interconnection structures BS.

The interconnection structures BS may be formed in the first region MA, and the peripheral device structures TR2, 130, 128a, 128b and 128c may be formed in the second region PA.

When viewed in a plan view, each of the gate structures GS1 may extend in a first direction X, and each of the interconnection structures BS may extend in a second direction Y, perpendicular to the first direction X.

The forming of each of the interconnection structures BS may include forming a conductive line 25 and an interconnection capping layer 28 sequentially stacked and forming insulating spacers 30 and 31 on side surfaces of the conductive line 25 and side surfaces of the interconnection capping layer 28.

In each of the interconnection structures BS, the conductive line 25 may include a first layer 25a, a second layer 25b, and a third layer 25c sequentially stacked, and a portion of the first layer 25a may extend downwardly to form a plug portion 25p, electrically connected to the first impurity region 9a, of the first source/drain regions SD1. In an embodiment, the plug portion 25p may contact the first impurity region 9a. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

In the conductive line 25, the first layer 25a may be formed of a doped silicon layer, and the second layer 25b may be formed of a metal-semiconductor compound layer (for example, WN, TiN, or the like), and the third layer 25c may be formed of a metal layer (for example, W, or the like).

In an example embodiment, the interconnection structures BS may be bitline structures. For example, the conductive line 25 may be a bitline including a plug portion 25p electrically connected to the first impurity region 9a. The conductive line 25 may be a bitline of a memory device such as a DRAM.

The insulating spacers 30 and 31 may include a first spacer portion 30 and a second spacer portion 31. The first spacer portion 30 may cover a side surface of the plug portion 25p. The second spacer portion 31 may cover side surfaces of the conductive line 25 and surfaces of the interconnection capping layer 28. The second spacer portion 31 may be positioned at a level higher than a level of the plug portion 25p. The present invention is not limited thereto. In an embodiment, the first spacer portion 30 and the second spacer portion 31 may be integrally formed in the same fabrication process.

The interconnection capping layer 28 may include a first layer 28a, a second layer 28b, and a third layer 28c sequentially stacked. The interconnection capping layer 28 may be formed of a silicon nitride and/or a silicon nitride-based insulating material.

The peripheral device structures TR2, 130, 128a, 128b, 128c, and 129 may include a peripheral transistor TR2.

The peripheral transistor TR2 may include second peripheral sources/drains SD2, spaced apart from each other in the peripheral active region 6a2, and a peripheral gate GS2 formed on a peripheral active region between the second peripheral sources/drains SD2.

The peripheral gate GS2 may include a peripheral gate dielectric 123 and a peripheral gate electrode 125 disposed on the peripheral gate dielectric 123.

The peripheral gate electrode 125 may include a first layer 125a, a second layer 125b, and a third layer 125c, sequentially stacked.

At least a portion of the peripheral gate electrode 125 may be formed of substantially the same material as at least a portion of the conductive line 25. For example, the first layer 125a of the peripheral gate electrode 125 and the first layer 25a of the conductive line 25 may be formed of a doped silicon layer, the second layer 125b of the peripheral gate electrode 125 and the second layer 25b of the conductive line 25 may be formed of a metal-semiconductor compound layer (for example, WN, TiN, or the like), and the third layer 125c of the peripheral gate electrode 125 and the third layer 25c of the conductive line 25 may be formed of a metal layer (for example, W, or the like). In an embodiment, the second layer 125b of the peripheral gate electrode 125 and the second layer 25b of the conductive line 25 may be formed of the same metal-semiconductor compound layer in the same fabrication process. In an embodiment, the third layer 125c of the peripheral gate electrode 125 and the third layer 25c of the conductive line 25 may be formed of the same metal layer in the same fabrication process.

The peripheral device structure TR2, 130, 128a, 128b, 128c, and 129 may further include a peripheral capping layer 128a, formed on the peripheral gate GS2, and peripheral spacers 129 formed on side surfaces of the peripheral gate GS2 and side surfaces the peripheral capping layer 128a.

The peripheral capping layer 128a may be formed of a silicon nitride.

The peripheral spacers 129 may include at least one of silicon oxide, silicon oxynitride, and silicon nitride.

The peripheral device structure TR2, 130, 128a, 128b, 128c, and 129 may further include an insulating liner 128b conformally covering the peripheral transistor TR2, the peripheral capping layer 128a, and the peripheral spacers 129, an interlayer insulating layer 130 on the insulating liner 128b, and an upper insulating layer 128c on the interlayer insulating layer 130. The interlayer insulating layer 130 may be formed on the insulating liner 128b on side surfaces of the peripheral gate GS2 and the peripheral capping layer 128a. The insulating liner 128b may be formed of silicon nitride or a silicon nitride-based material. The interlayer insulating layer 130 may be formed of silicon oxide. The upper insulating layer 128c may be formed of silicon nitride or a silicon nitride-based material.

Referring to FIGS. 1A, 2, 5A, and 5B, in operation S15, an insulating layer 135 may be formed between the interconnection structures BS. The insulating layer 135 may include or may be formed of silicon oxide, but example embodiments are not limited thereto. For example, the insulating layer 135 may be a material which may fill the opening 33 between the interconnection structures BS without a void. In some embodiments, the insulating layer 135 may be formed in spaces between two adjacent interconnection structures of the interconnection structures BS, completely filling the spaces.

In operation S20, a first mask layer 138 and a second mask layer 141 may be sequentially formed. The first and second mask layers 138 and 141, sequentially stacked, may be formed on the interconnection structures BS, the insulating layer 135, and the upper insulating layer 128c.

The first and second mask layers 138 and 141 may be formed of materials having etch selectivity with respect to the material of the upper insulating layer 128c and the interconnection capping layer 28. The first and second mask layers 138 and 141 may be formed of materials having different levels of etch selectivity with respect to the material of the upper insulating layer 128c and the interconnection capping layer 28. For example, the upper insulating layer 128c and the interconnection capping layer 28 may be formed of silicon nitride and/or a silicon nitride-based insulating material, the first mask layer 138 may be formed of oxide (e.g., silicon oxide) or an oxide-based material, and the second mask layer 141 may be formed of polysilicon. For example, the first mask layer 138 may be formed of a silicon oxide.

Referring to FIGS. 1A, 2, 6A and 6B, in operation S25, the first and second mask layers (138 and 141 of FIGS. 5A and 5B) in the first region MA may be patterned to form a first mask structure 143a, including a first mask pattern 138a and a second mask pattern 141a sequentially stacked in the first region MA, and a second mask structure 143b including the first and second mask layers 138b and 141b remaining in the second region PA.

Figure 5A:
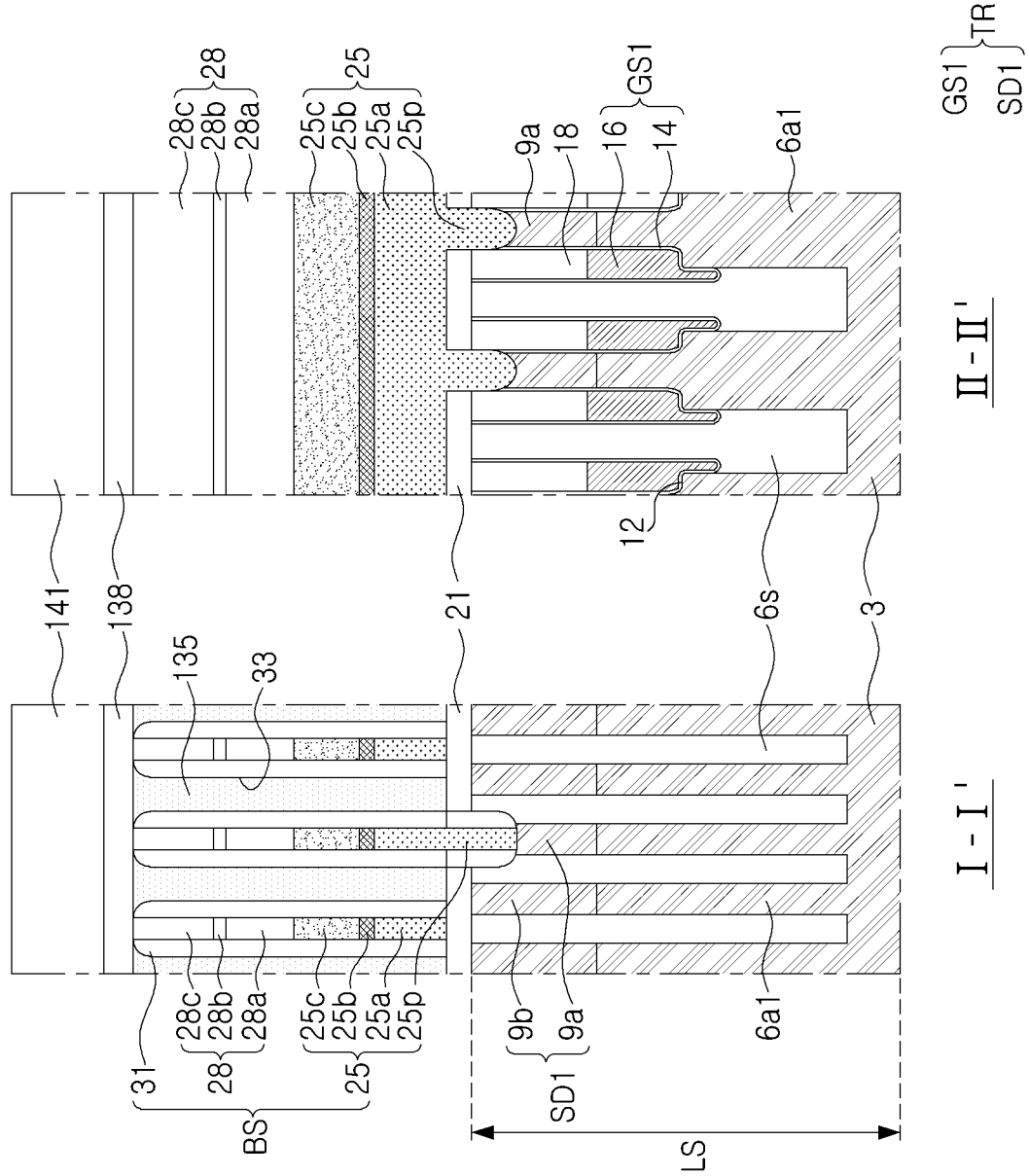
Figure 5B:
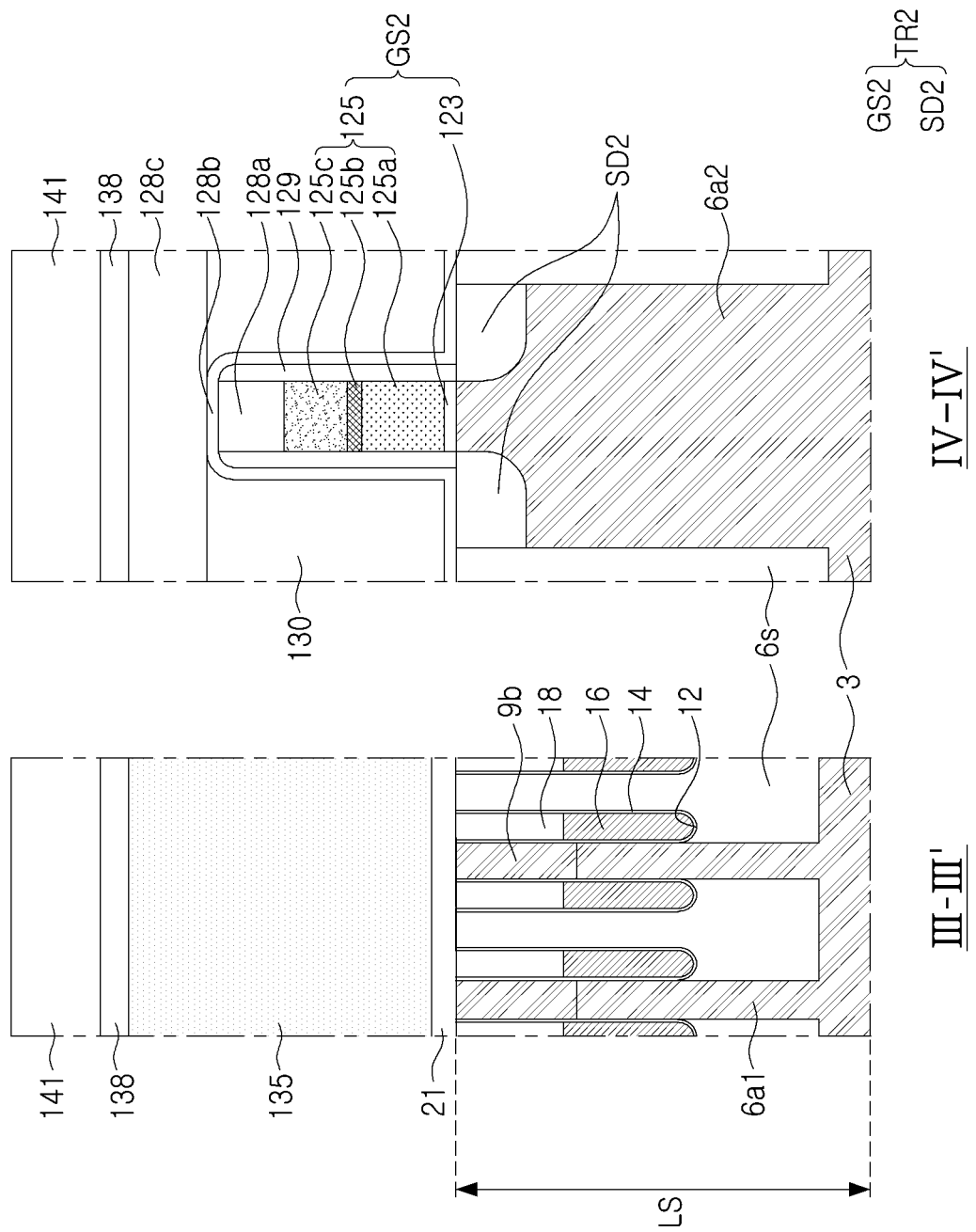

In operation S30, the insulating layer 135 of FIGS. 5A and 5B may be etched by an etching process using the first and second mask structures 143a and 143b as etching masks to form insulating patterns 135a between the interconnection structures BS. While forming the insulating patterns 135a, a portion of a lower portion of the insulating layer (135 of FIGS. 5A and 5B) may be etched. For example, openings 145 may be formed between the insulating patterns 135a, and the openings 145 may extend downwardly to penetrate through the buffer insulating layer 21.

In some embodiments, the openings 145 may be referred to as fence holes.

During a time when the etching process of forming the insulating patterns 135a is performed, a portion of the second mask pattern 141a of the first mask structure 143a may be etched, and a portion of the mask layer 141b of the second mask structure 143b may be etched.

In an example embodiment, a thickness of the second mask layer 141b of the second mask structure 143b may be greater than a thickness of the second mask pattern 141a of the first mask structure 143a.

Referring to FIGS. 1A, 2, 7A, and 7B, in operation S40, a sacrificial layer 148 may be formed to fill at least a space between the insulating patterns 135a.

The sacrificial layer 148 may cover a portion of a side surface of the first mask pattern 138a while filling the space between the insulating patterns 135a. For example, an upper surface of the sacrificial layer 148 may be formed at a level, higher than or equal to a level of a lower surface of the first mask pattern 138a and lower than a level of the second mask pattern 141a. The sacrificial layer 148 may be formed of a spin-on-hardmask (SOH) material.

After the sacrificial layer 148 is formed, the second mask layer 141b of the second mask structure 143b may have a first thickness T1.

Referring to FIGS. 1B, 2, 8A, and 8B, in operation S50, the structure formed up to the sacrificial layer 148 may be loaded into a process chamber. The process chamber may be a plasma process chamber. In some embodiments, the semiconductor substrate 3 with the sacrificial layer 148 may be loaded into a process chamber immediately after the formation of the sacrificial layer 148.

In operation S55, in the process chamber, the second mask pattern 141a may be removed by a dry etching process. The dry etching process may be a plasma etching process.

The removing the second mask pattern 141a may include performing a first etching process of removing a native oxide, which may be formed on a surface of the second mask pattern 141a, and performing a second etching process of removing the second mask pattern 141a. When the second mask pattern 141a is formed of polysilicon, the second mask pattern 141a may be removed by a plasma etching process using a $Cl_2$-based source gas.

Figure 7A:
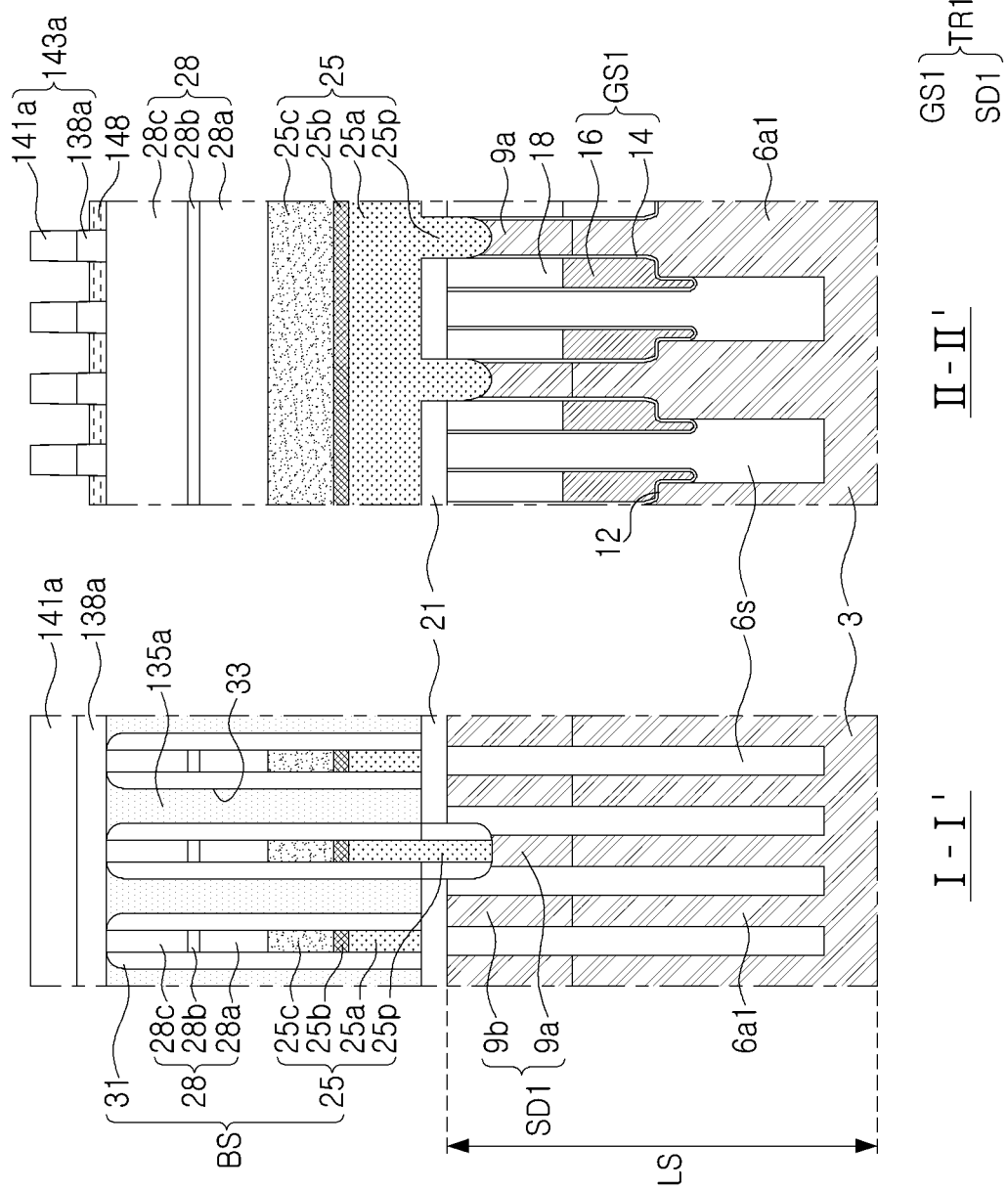
Figure 7B:
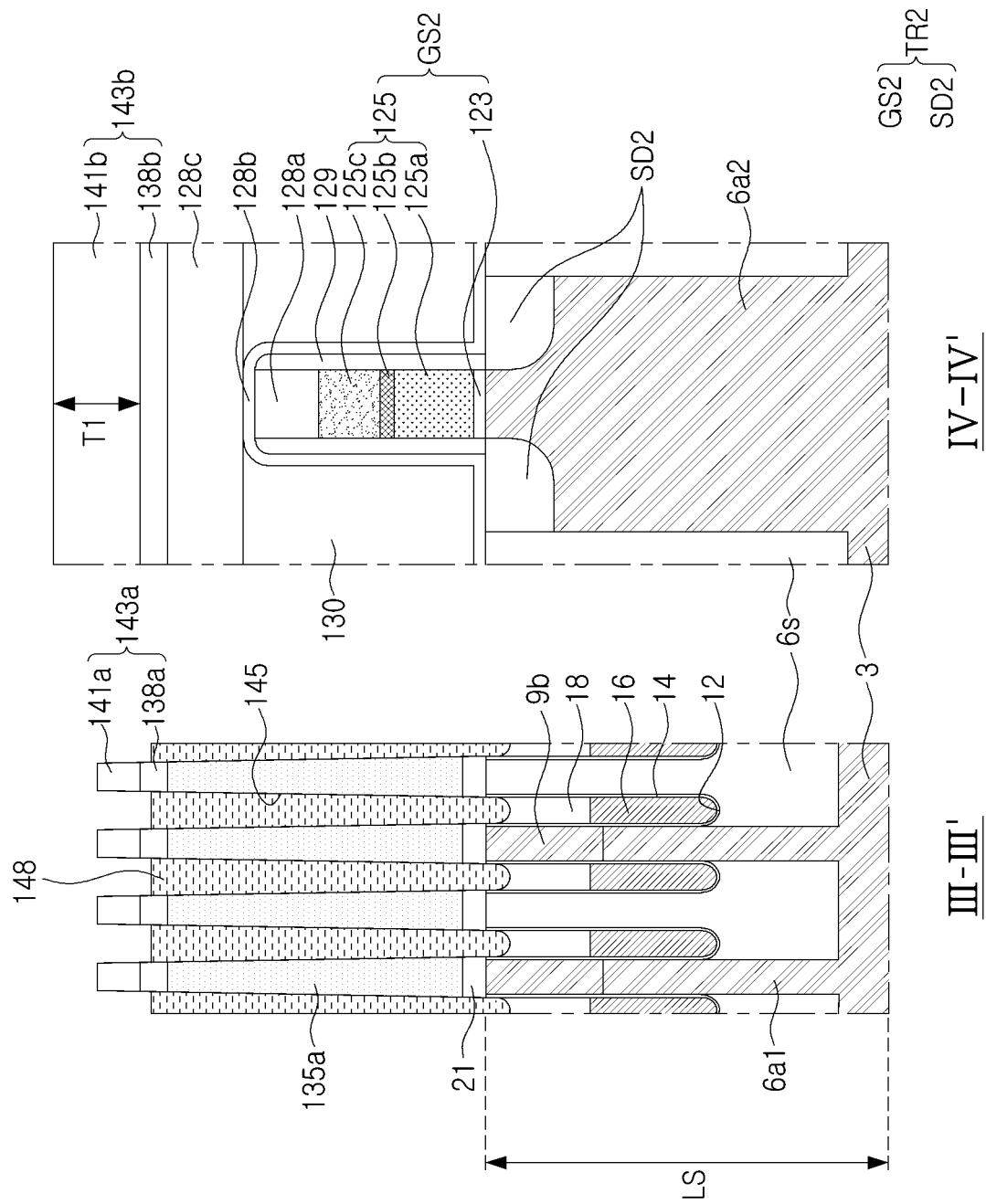
Figure 8A:
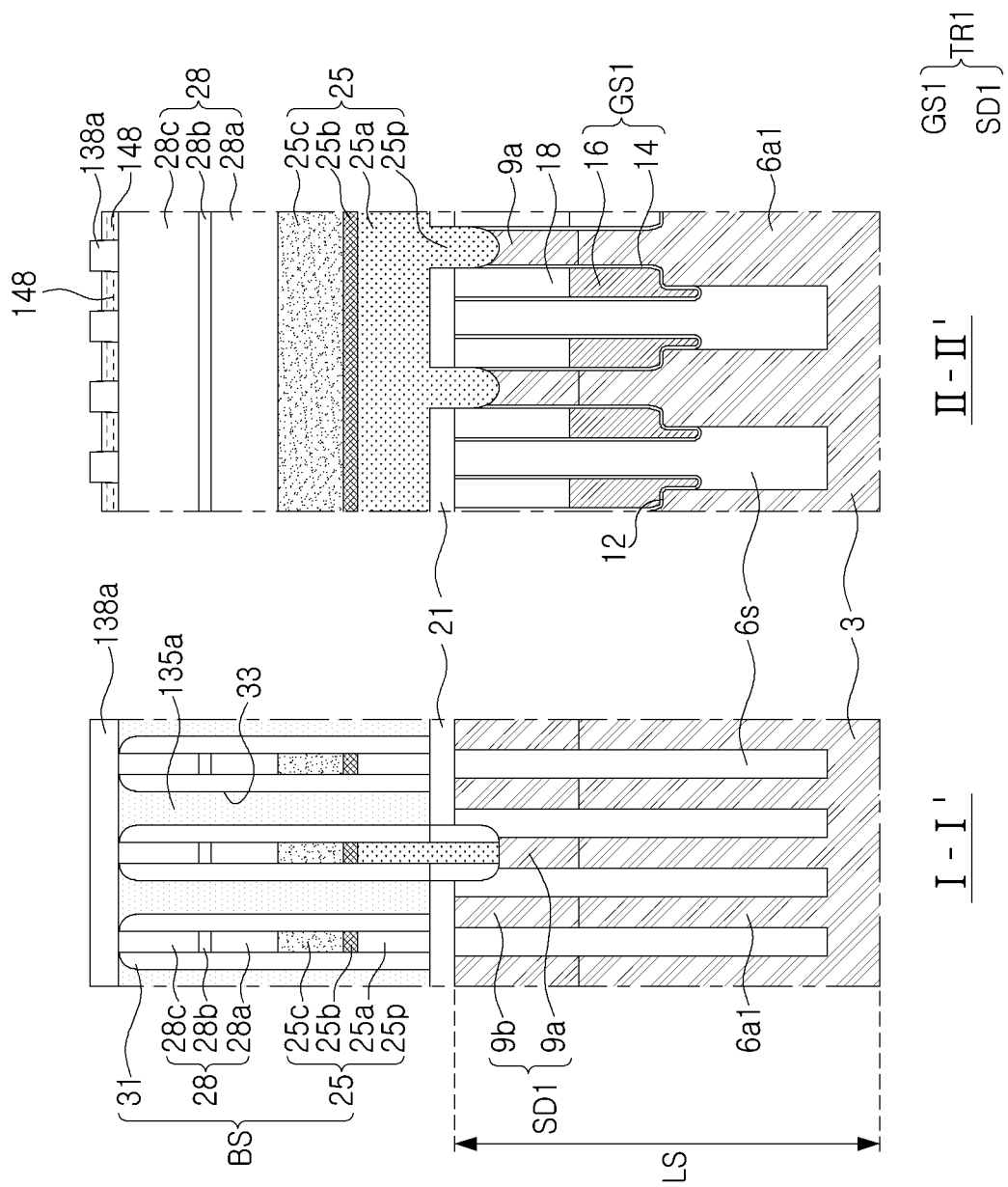
Figure 8B:
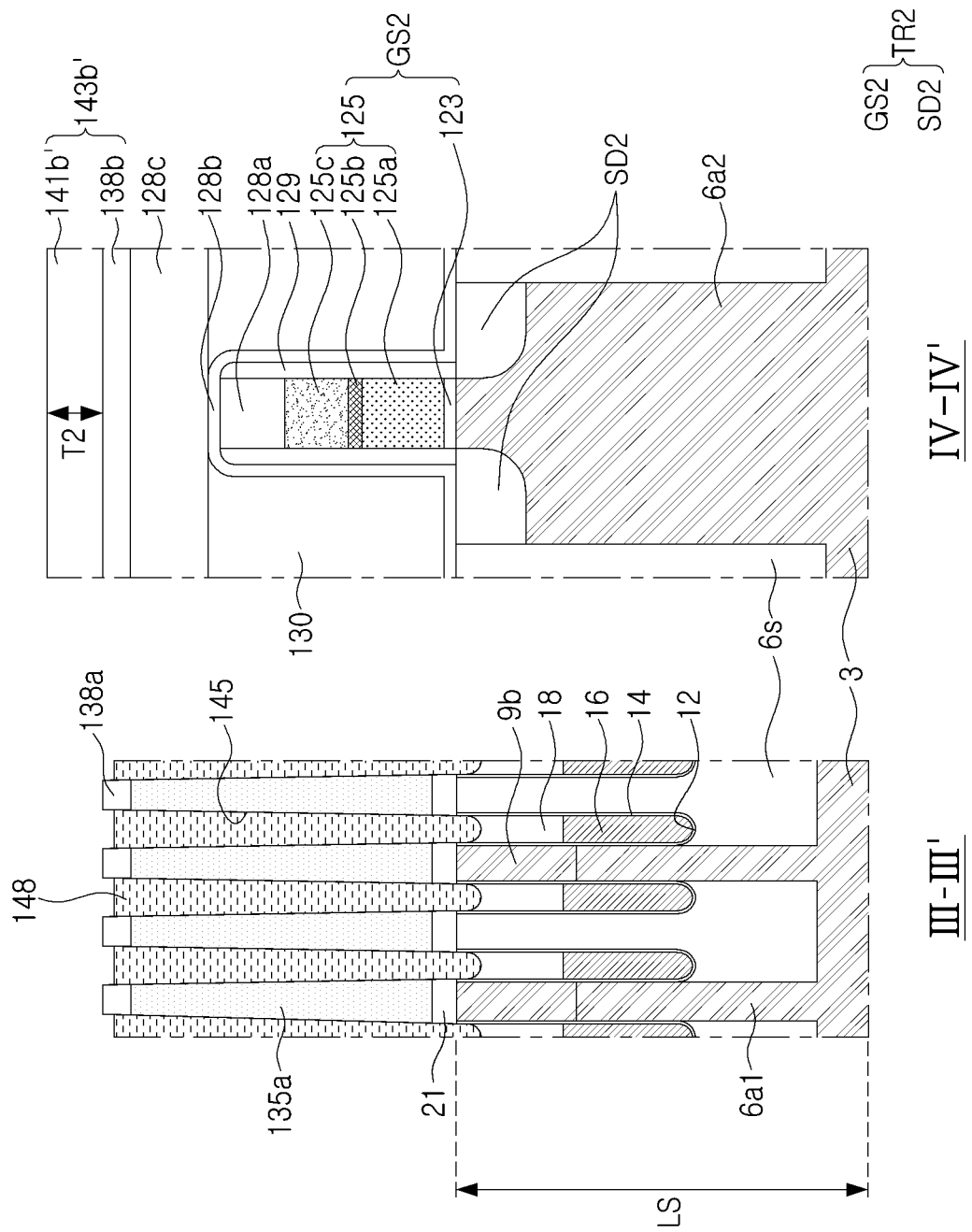

A thickness of the second mask layer 141b of the second mask structure 143b of FIG. 7B may be reduced during a time when the dry etching process of removing the second mask pattern 141a is performed. Accordingly, the second mask layer (141b of FIG. 7B) may be formed as a second mask layer 141b' having a second thickness T2, smaller than the first thickness (T1 of FIG. 7B). Thus, the second mask structure (143b of FIG. 7B) may be formed as a second mask structure 143b' including the second mask layer 141b' having a reduced thickness compared to the thickness of the second mask layer 141b of FIGS. 7A and 7B.

Referring to FIGS. 1B, 2, 9A, and 9B, an anti-oxidation layer 141p may be formed on a surface of the second mask layer 141b' in the second region PA. In operation S60, for example, in the process chamber, the anti-oxidation layer 141p may be formed on the surface of the second mask layer 141b' in the second region PA by performing a hydrogen plasma treatment process 151. The anti-oxidation layer 141p may be formed by bonding silicon elements of polysilicon of the second mask layer 141b' to hydrogen elements supplied by the hydrogen plasma treatment process 151. In some embodiments, in the hydrogen plasma treatment process 151, dangling bonds of polysilicon at the surface of the second mask layer 141b' may be terminated with hydrogen atoms, thereby preventing a native oxide from forming at the surface of the second mask layer 141b'. Accordingly, a second mask structure 143b'', including the second mask layer 141b' having a surface on which the anti-oxidation layer 141p is formed, may be formed.

In operation S65, a structure formed up to the anti-oxidation layer 141p may be unloaded from the process chamber. In an embodiment, the semiconductor substrate 3 with the anti-oxidation layer 141p may be unloaded from the process chamber immediately after the formation of the anti-oxidation layer 141p.

Figure 9B:
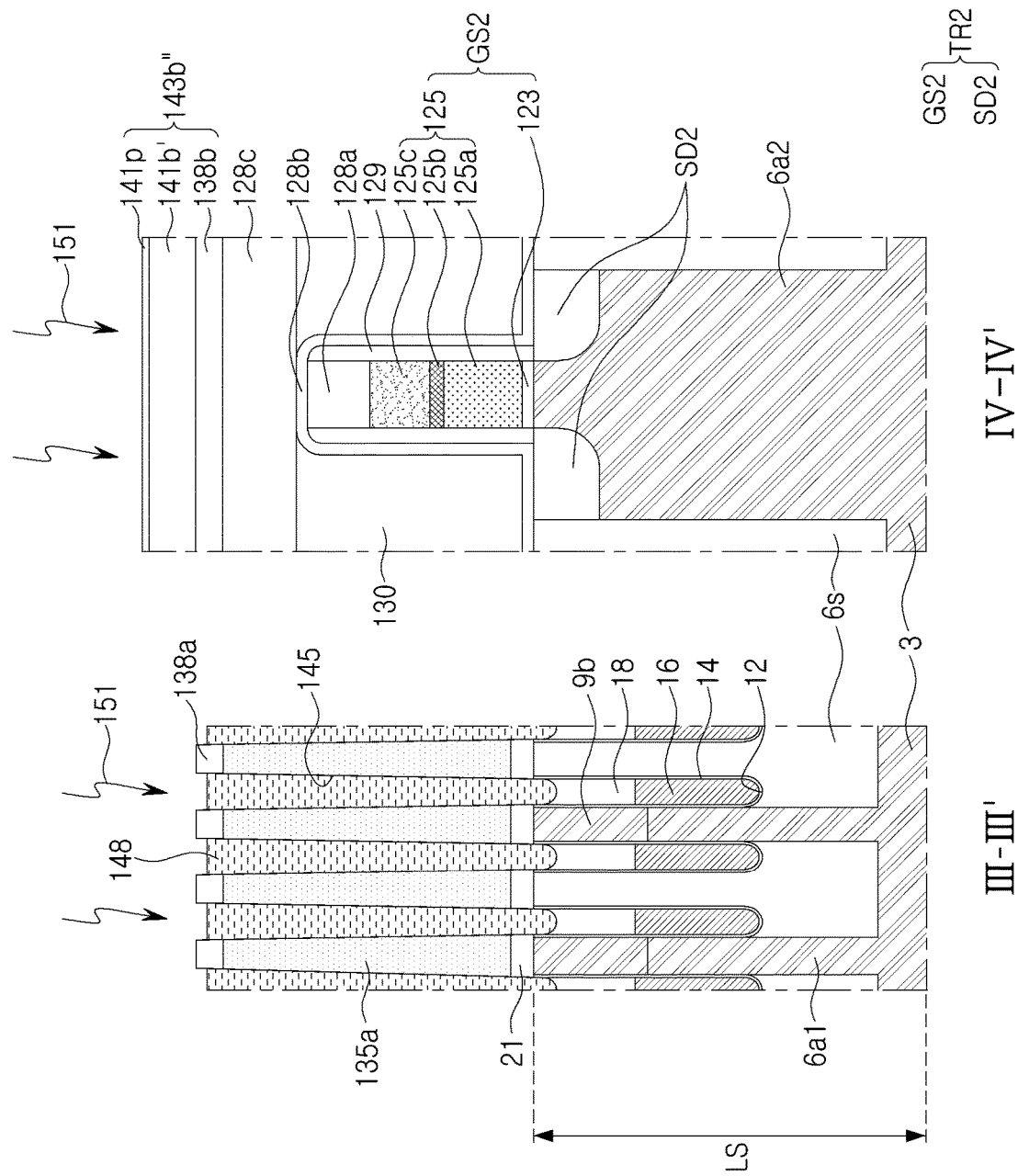
Figure 10:
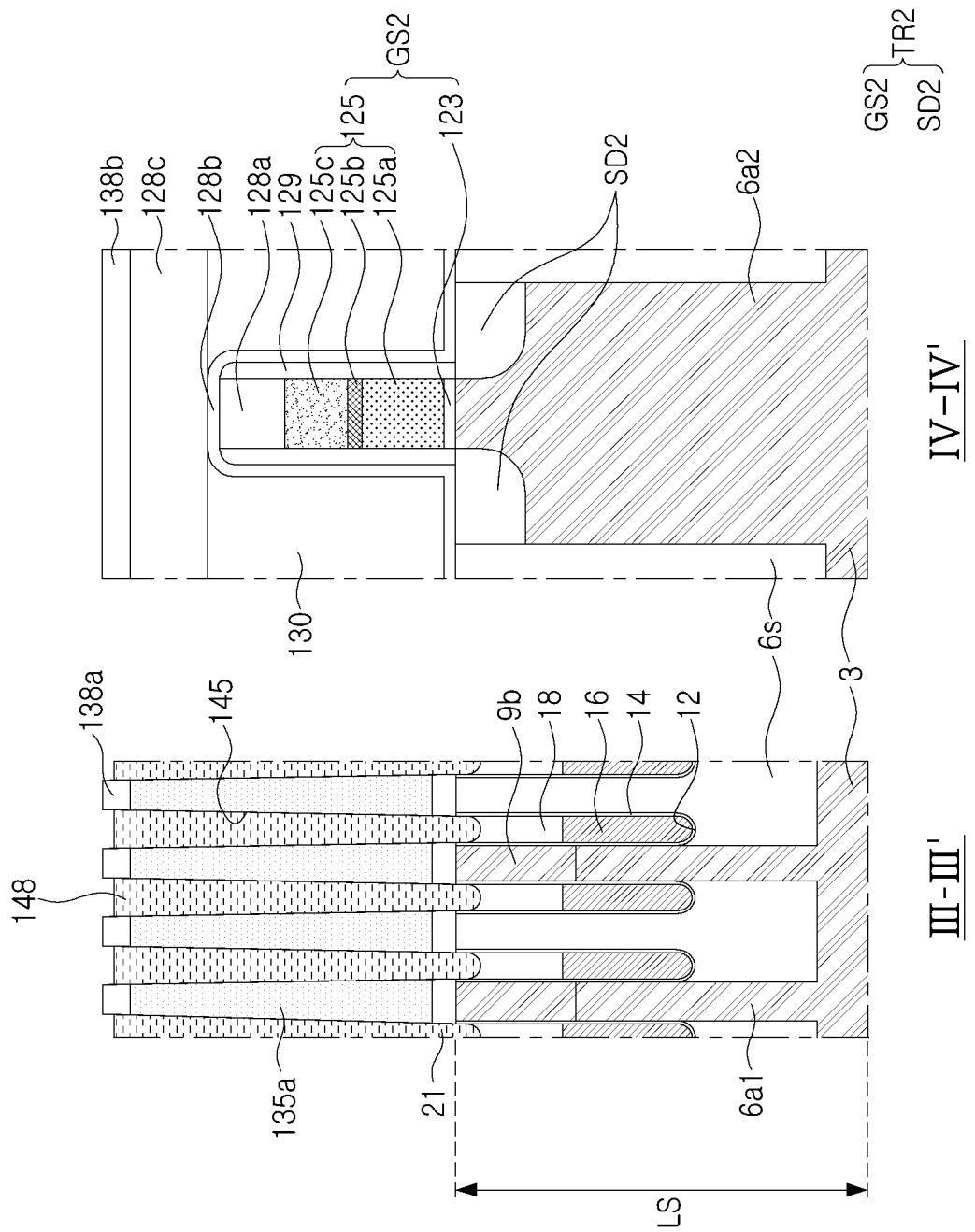
Figure 11A:
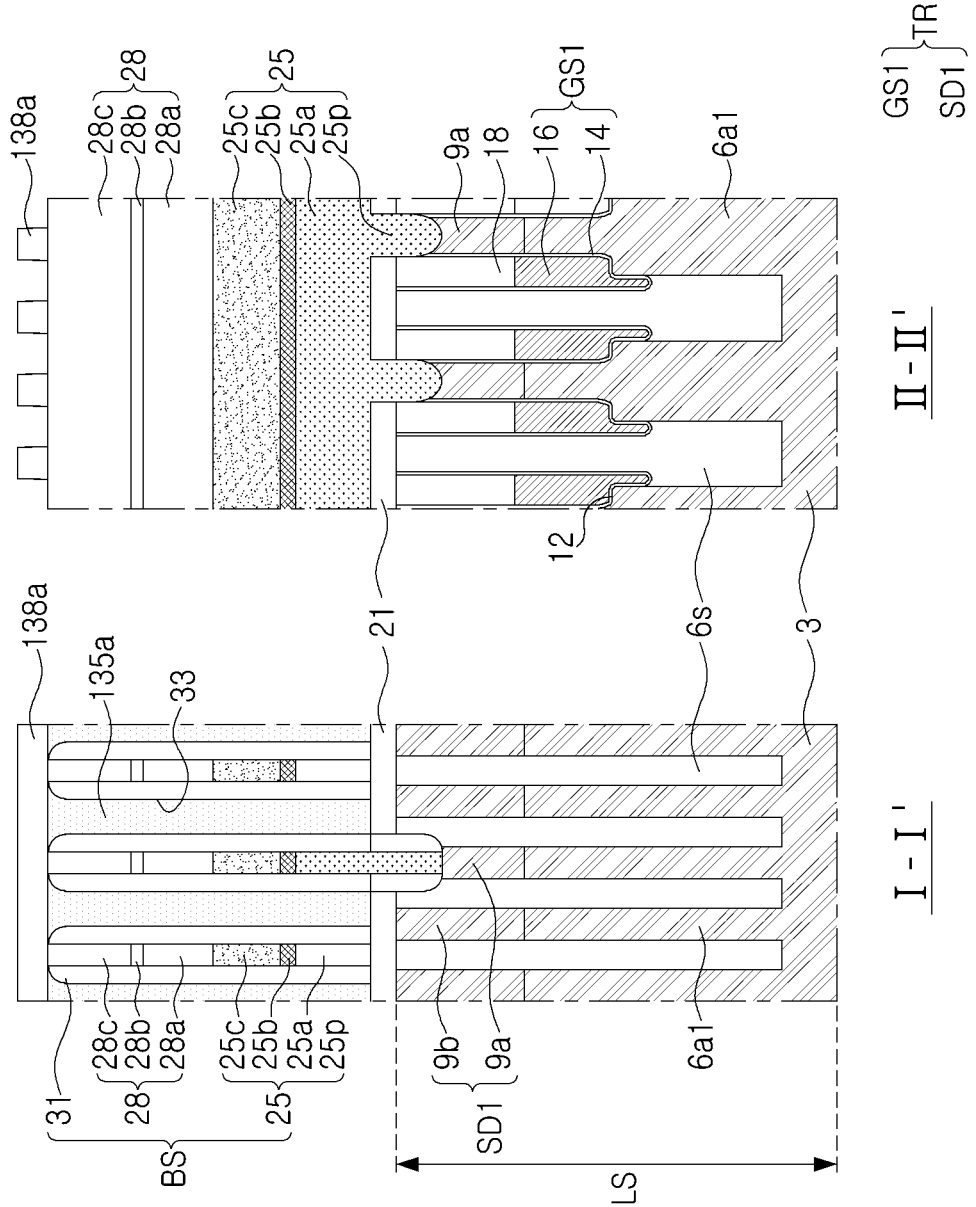
Figure 11B:
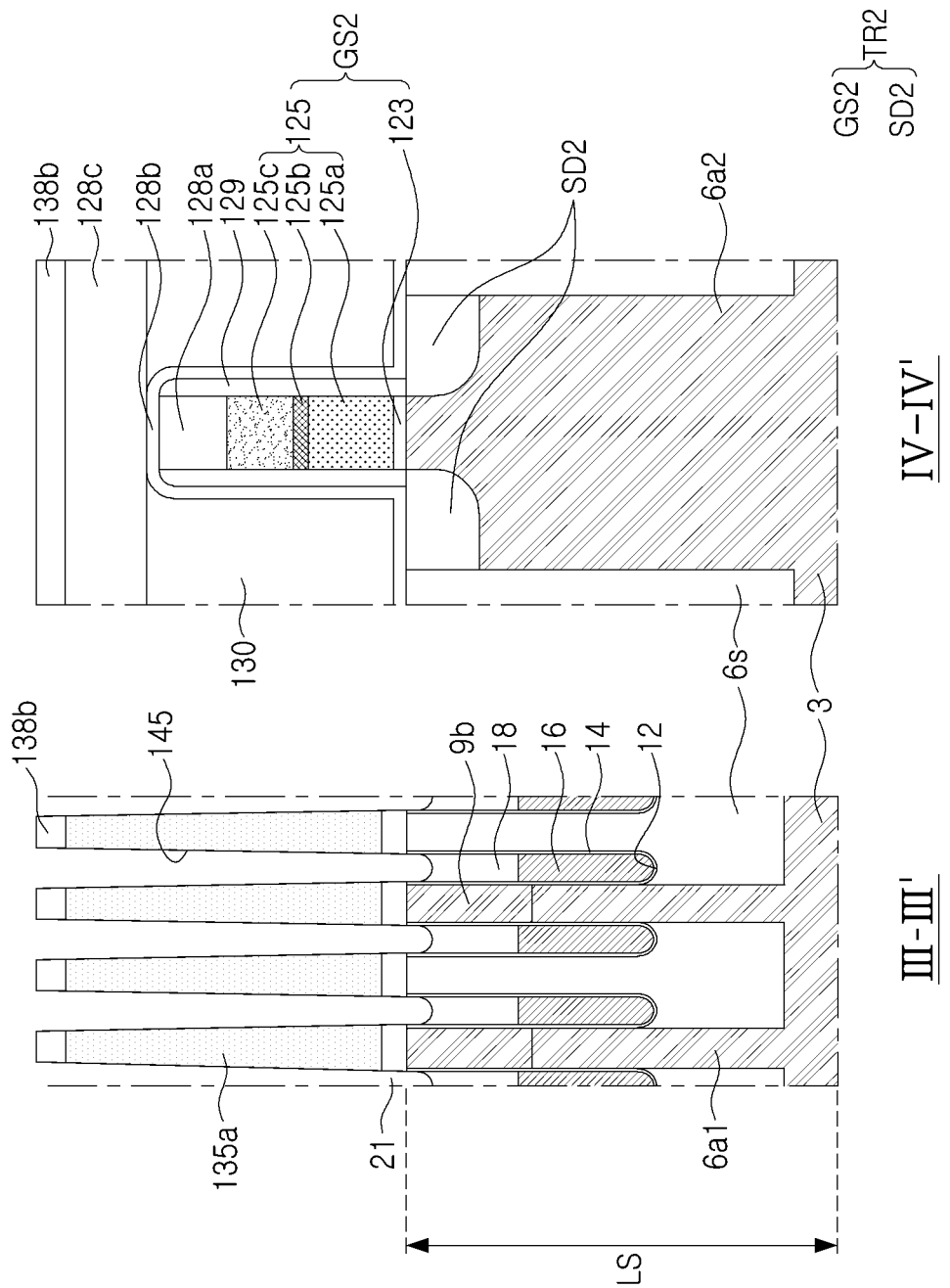
Figure 12A:
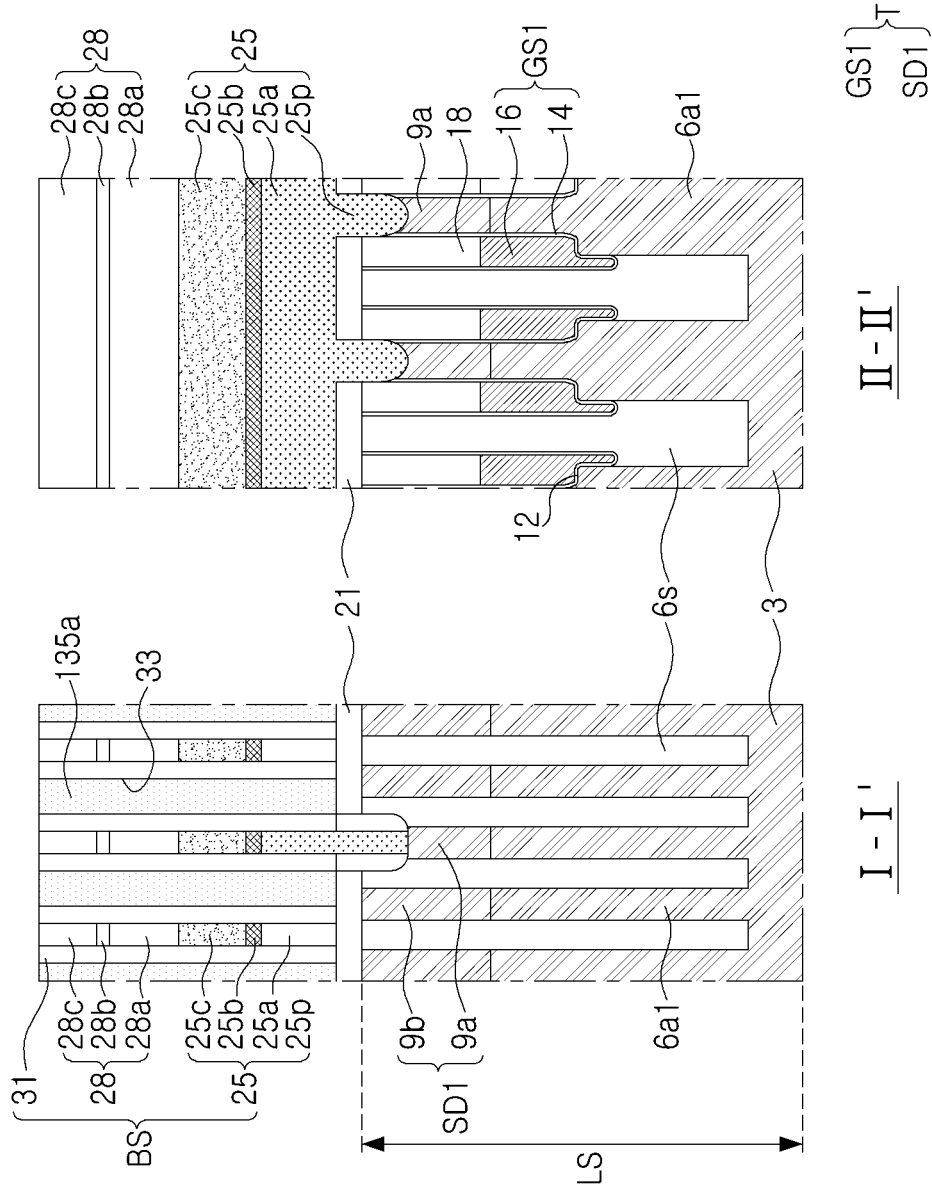
Figure 12B:
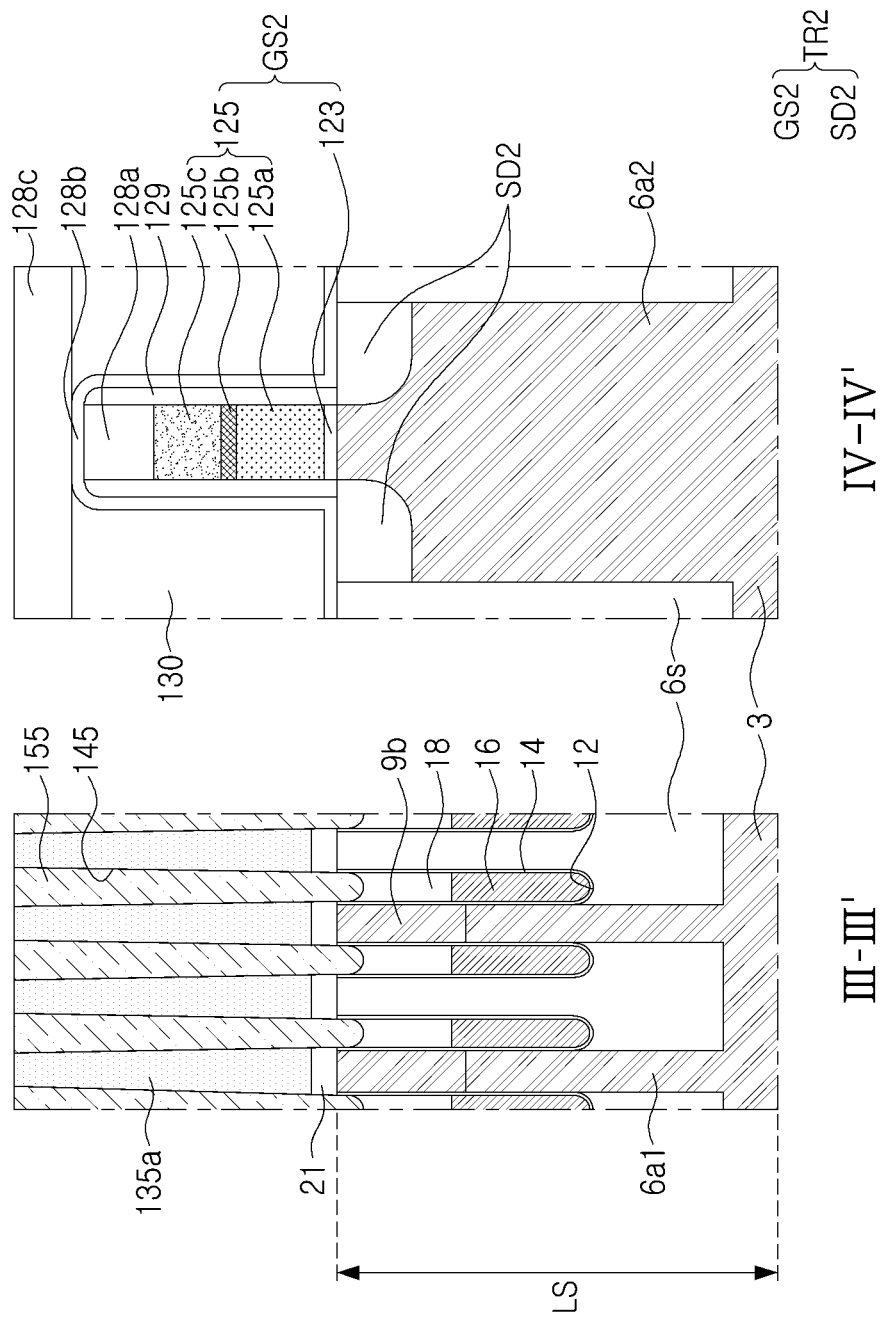

Referring to FIGS. 1B, 2, and 10, the second mask layer (141b' of FIG. 9B), having the surface on which the anti-oxidation layer (141p of FIG. 9B) is formed, may be selectively removed. In operation S70, for example, the second mask layer (141b' of FIG. 9B), having the surface on which the anti-oxidation layer (141p of FIG. 9B) is formed, may be removed by a wet etching process. For example, the second mask layer (141b' of FIG. 9B) formed of polysilicon may be removed by a wet etching process using $NH_4OH$ and $H_2O_2$ as an etchant. In some embodiments, when the second mask layer 141b' of FIG. 9B is removed, the anti-oxidation layer which is formed on the second mask layer 141b' is removed.

Referring to FIGS. 1B, 2, 11A, and 11B, in operation S75, the sacrificial layer 148 may be selectively removed to form fence holes 145. The fence holes 145 may be substantially the same as the openings of FIG. 6B. During a time when the sacrificial layer 148 is selectively removed, the first mask pattern 138a and the first mask layer 138b may remain unetched.

Referring to FIGS. 1B, 2, 12A, and 12B, insulating fences 155 may be formed in the fence holes 145. The insulating fences 155 may be formed of silicon nitride or a silicon nitride-based insulating material.

In an embodiment, the first mask pattern 138a and the first mask layer 138b may be removed during formation of the insulating fences 155.

In an embodiment, the first mask pattern 138a and the first mask layer 138b may remain after formation of the insulating fences 155.

Referring to FIGS. 1B, 2, 13A, and 13B, in operation S85, first contact holes 157 may be formed. In the formation of the first contact holes 157, an etching process using the insulating fences 155, the interconnection structures BS, and the upper insulating layer 128c as etching masks may be performed such that a portion of lower portions of the insulating patterns (135a of FIGS. 12A and 12B) are etched to form the first contact hole 157. For example, the buffer insulating layer 21 below the insulating patterns 135a of FIGS. 12A and 12B may be etched. The second impurity regions 9b and the first contact holes 157 may overlap each other in a vertical direction Z. In operation S90, first contact plugs 60 may be formed in the first contact holes 157. In some embodiments, the first contact holes 157 may expose the second impurity regions 9b. The exposed second impurity regions 9b may be recessed during a time when the first contact holes 157 are formed. The first contact plugs 60 may contact the exposed second impurity regions 9b.

Second contact plugs 160s and 160 may be formed to be electrically connected to the second sources/drains SD2 in the second region PA while the first contact plugs 60 are formed in the first region MA.

First pads 60p on the first contact plugs 60 and second pads 160p on the second contact plugs 160s and 160 may be formed while forming the first contact plugs 60 and the second contact plugs 160s and 160. In some embodiments, the first pads 60p and the first contact plugs 60 may be integrally formed in the same process. In some embodiments, the second pads 160p and the plug portions 160 of the second contact plugs 160s and 160 may be integrally formed in the same process.

In an example, in the formation of the first and second contact plugs 60, 160s and 160 and the first and second pads 60p and 160P, a preliminary layer may be formed to fill the first contact holes 157. A second contact hole 158 may be formed to sequentially penetrate through the upper insulating layer 128c, the interlayer insulating layer 130, and the insulating liner 128b in the second region PA. The second contact hole 158 may expose the second sources/drains SD2. A portion of the preliminary layer may be etched to form a lower layer 60a in the first contact holes 157. A first metal-semiconductor compound layer 60b and a second metal-semiconductor compound layer 160s may be simultaneously formed on the lower layer 60a in the first contact holes 157 and the second sources/drains SD2 exposed by the second contact hole 158, respectively. An upper layer 60c filling a remaining portion of the first contact holes 157 and a plug portion 160 filling a remaining portion of the second contact holes 158 may be formed. Thus, the first contact plug 60, including the lower layer 60a, the first metal-semiconductor compound layer 60b, and the upper layer 60c formed in each of the first contact holes 157, and the second contact plugs 160s and 160, including the second metal-semiconductor compound layer 160s and the plug portion 160 formed in each of the second contact holes 158, may be formed.

In an example, after the first metal-semiconductor compound layer 60b and the second metal-semiconductor compound layer 160s may be simultaneously formed on the lower layer 60a in the first contact holes 157 and the second sources/drains SD2 exposed by the second contact hole 158, respectively, a conductive material layer may be formed to fill remaining portions of the first contact holes 157 and a remaining portion of the second contact hole 158 and to cover the interconnection structures BS, the insulating fences 155, and the upper insulating layer 128c. A separation insulating layer 65 may be formed to penetrate through the conductive material layer and to define the first and second pads 60p and 160p. For example, the separation insulating layer 65 may separate the conductive material layer into the first and second pads 60p and 160p. The separation insulating layer 65 may be formed of silicon nitride. The conductive material layer filling the remaining portions of the first contact holes 157 and the conductive material layer filling the remaining portions of the second contact holes 158 may be defined as the upper layer 60c and the plug portion 160, respectively.

According to the above-described method of fabricating a semiconductor device, the first contact plugs (60 of FIGS. 13A and 13B) may be stably and reliably formed. For example, the insulating layer (135 of FIGS. 5A and 5B) may be patterned using the first and second masks (138 and 141 of FIGS. 5A and 5B) formed of different materials. To remove the first and second mask structures 143a and 143b remaining after the insulating layer 135 is patterned to form the insulating patterns 135a in FIGS. 6A and 6B, 7A to 9B, as illustrated in FIGS. 7A to 9B, the sacrificial layer 148 may be formed, the second mask pattern in the first region MA may be removed by a dry etching process, a hydrogen plasma treatment process 151 may be performed to form the anti-oxidation layer (141p of FIG. 9B) on a surface of the second mask layer 141b' in the second region PA, and the second mask layer 141b', on which the anti-oxidation layer (141p of FIG. 9B) is formed, may be removed by the wet etching process. According to such a method, the insulating patterns 135a may be formed without damage or defects. Accordingly, the insulating fences (155 of FIG. 12B) formed between the insulating patterns 135a may be formed without deformation or defects and the insulating fences (155 of FIG. 12B) may be stably formed. Therefore, the first contact plugs (60 of FIGS. 13A and 13B) formed between the insulating fences (155 in FIG. 12B) may be formed without defects. As a result, the first contact plugs (60 of FIGS. 13A and 13B) may be stably and reliably formed.

A semiconductor device 1, fabricated by the above-described method of fabricating a semiconductor device, may be provided. The semiconductor device 1 may include the lower structure LS, the interconnection structures BS, the peripheral device structure TR2, 130, 128a, 128b, 128c, and 129, and the insulating fences 155, the first contact plugs 60, the second contact plugs 160s and 160, the first and second pads 60p and 160p, and the separation insulating layer 65 described above.

Hereinafter, various modified examples of the method of fabricating a semiconductor device according to an example embodiment will be described. Various modified examples to be described below will be mainly described with respect to modified or replaced components.

Figure 14:
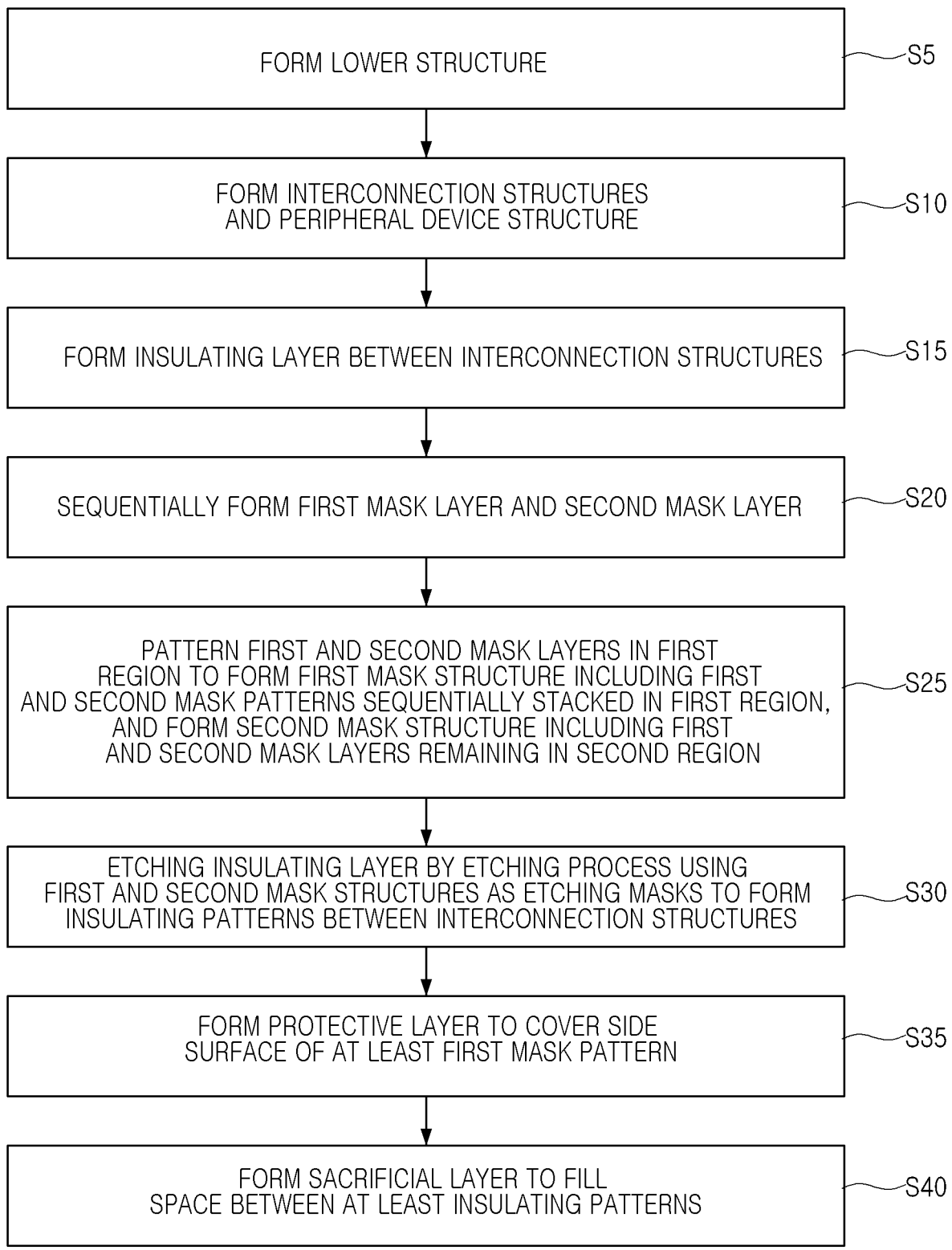
FIG. 14 is a process flowchart illustrating another example of a method of fabricating a semiconductor device according to an example embodiment.

A modified example of the method of fabricating a semiconductor device according to an example embodiment will be described with reference to FIGS. 14 and 15A to 20 along with FIGS. 1B and 2. FIG. 14 is a process flowchart illustrating a modified example of the method for fabricating a semiconductor device according to an example embodiment, and FIGS. 15A to 20 are cross-sectional views illustrating a modified example of the method for fabricating a semiconductor device according to an example embodiment. In FIGS. 15A to 20, FIGS. 15A, 16A, 17A, and 18A are cross-sectional views illustrating regions taken along lines I-I' and II-II' of FIG. 2, and FIGS. 15B, 16B and 18A, 17B, 18B, 19, and 20 are cross-sectional views illustrating regions taken along lines and IV-IV' of FIG. 2.

Figure 6A:
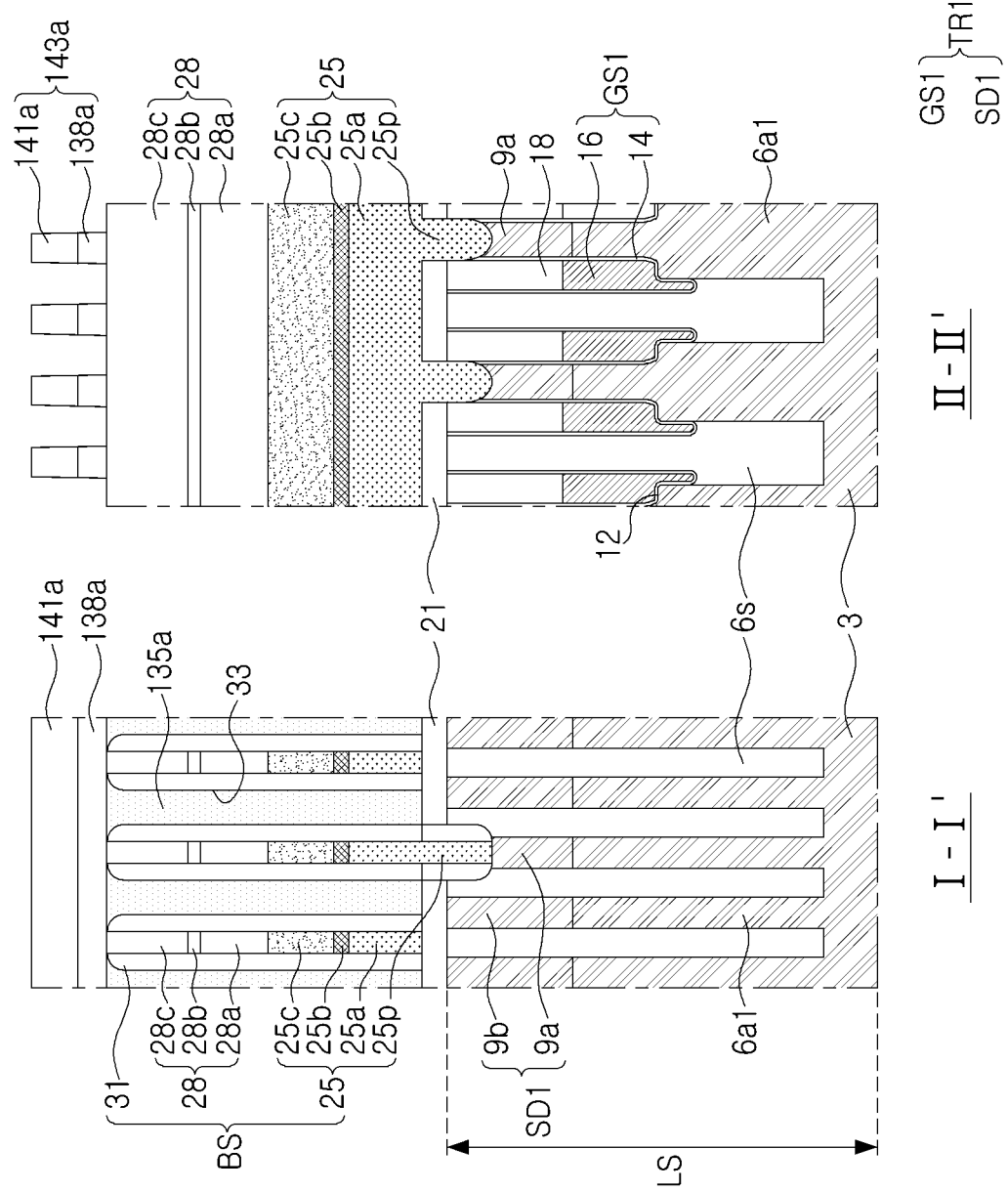
Figure 6B:
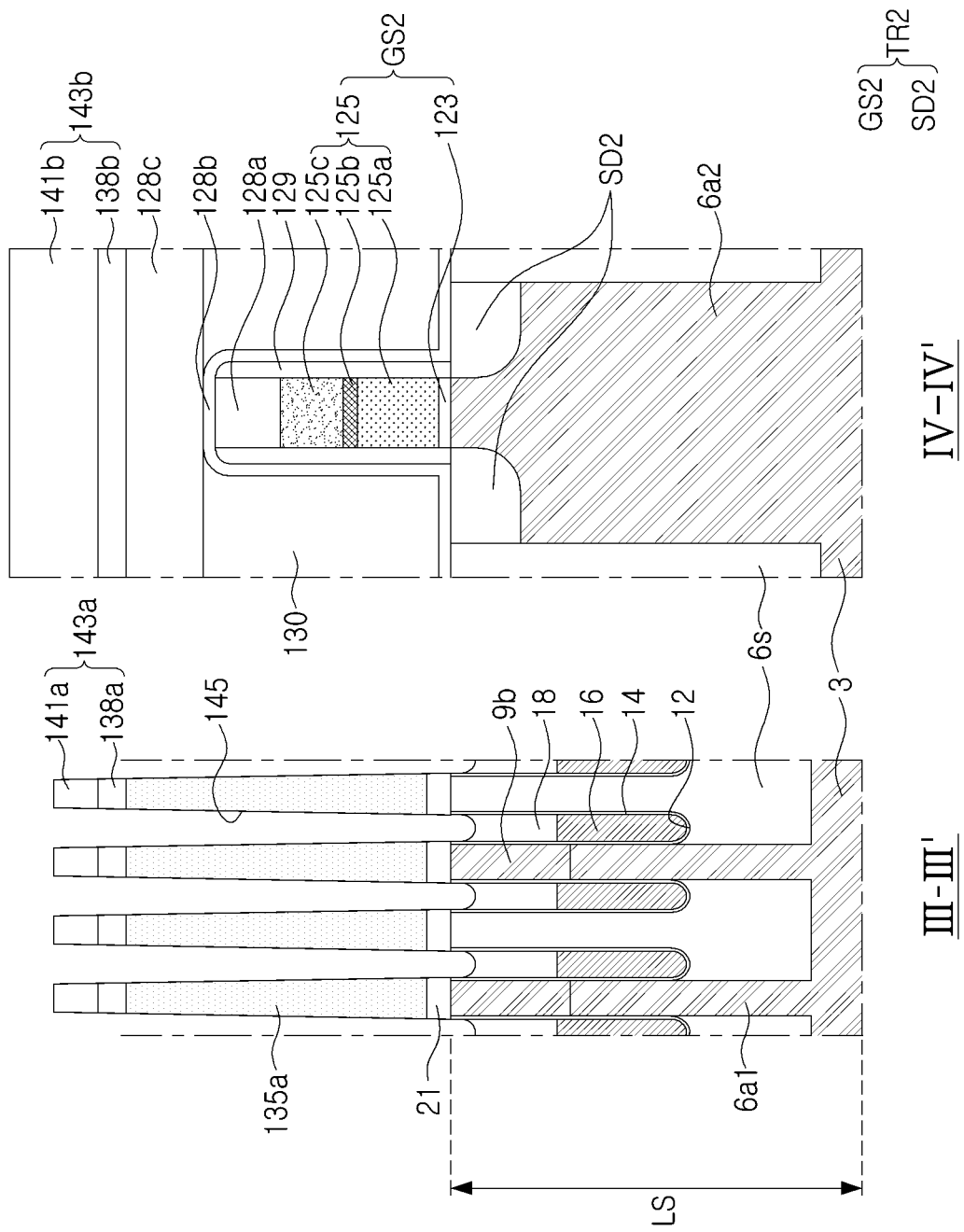

Referring to FIGS. 2, 14, 15A, and 15B, after operation S30 of forming the insulating patterns 135a as described in FIGS. 1A, 6A, and 6B, operation S35 may be performed to form a protective layer 246. The protective layer 246 may be formed to cover a side surface of at least the first mask pattern 138a. The protective layer 246 may be a silicon oxide layer. For example, the protective layer 246 may be a silicon oxide layer formed by an atomic layer deposition (ALD) process.

In an example, the protective layer 246 may be formed to a thickness between about 20 angstroms and about 30 angstroms. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In an example, the protective layer 246 may conformally cover internal walls of the openings 145 and exposed surfaces of the first and second mask structures 143a and 143b.

In an embodiment, the protective layer 246 may cover exposed surfaces of the first and second mask structures 143a and 143b without covering a portion of internal walls of the openings 145.

In an embodiment, grooves may be formed in upper regions of the cell gate capping layers 18 by the openings 145, and the protective layer 246 may include portions 246p filling the grooves. The portions 246p filling the grooves will be referred to as "protective patterns."

In operation S40, a sacrificial layer 148 may be formed to fill a space between the insulating patterns 135a. The sacrificial layer 148 may be formed on the protective layer 246.

Then, a semiconductor device may be fabricated using a method substantially the same as or similar to the method as described with reference to FIGS. 1B and 8A to 13B. Hereinafter, the method described with reference to FIGS. 1B and 8A to 13B will be supplementarily described.

Referring to FIGS. 1B, 2, 16A, and 16B, in operation S55 of removing a second mask pattern 141a by a dry etching process in the process chamber as described with reference to FIGS. 1A, 7A, and 7B, a first etching process may be performed to remove the protective layer (246 of FIGS. 15A and 15B) disposed on upper surfaces of at least the second mask pattern 141a and the second mask layer 141b, instead of a native oxide layer which may be formed on a surface of the second mask pattern 141a. In the protective layer (246 of FIGS. 15A and 15B), the remaining protective layer 246' may cover at least a portion of a side surface of the first mask pattern 138a.

Referring to FIGS. 1B, 2, 17A, and 17B, when the second mask pattern 141a is formed of polysilicon, the second mask pattern 141a may be removed by a plasma etching process using a $Cl_2$-based source gas. In this case, the second mask layer 141b' having a second thickness T2 as described with reference to FIG. 8B may remain in the second region PA.

Figure 9A:
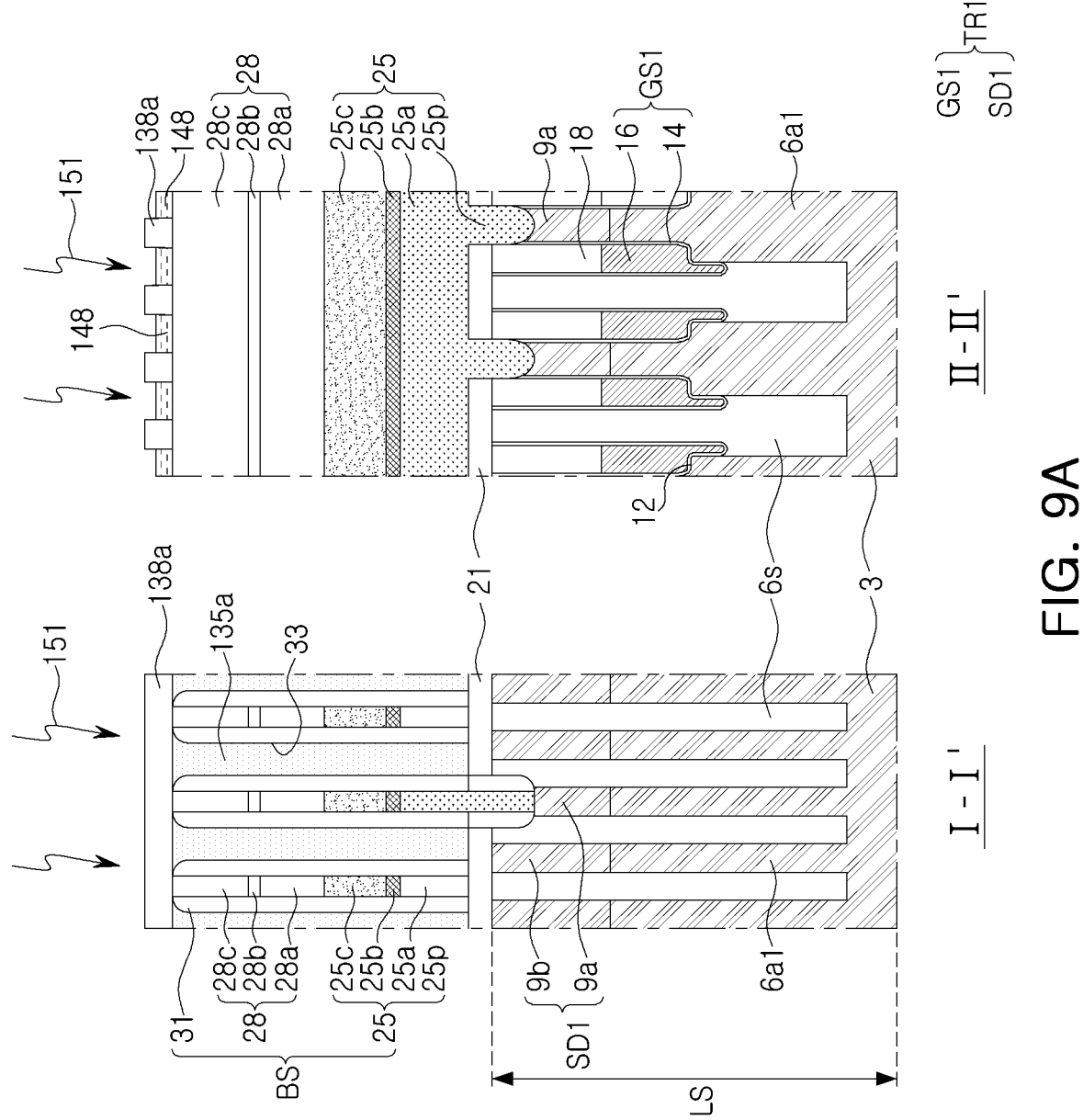

Referring to FIGS. 1B, 2, 18A, and 18B, in operation S60, similarly to the description provided with reference to FIGS. 9A and 9B, a hydrogen plasma treatment process 151 may be performed to form the anti-oxidation layer 141p on a surface of the second mask layer 141b' in the second region PA.

Figure 19:
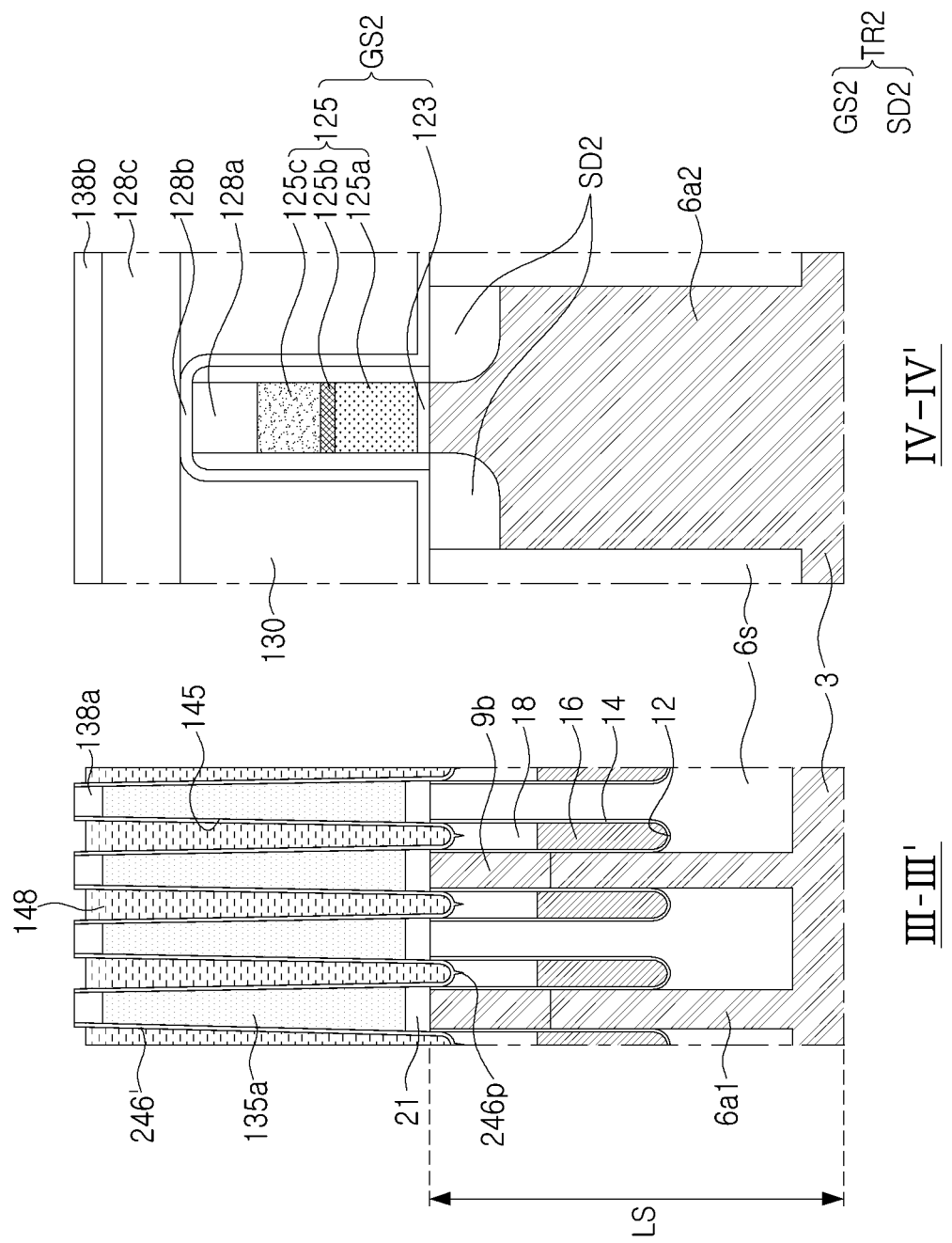

Referring to FIGS. 1B, 2, and 19, in operation S70, similarly to the description provided with reference to FIG. 10, the second mask layer (141b' in FIG. 18B), on which the anti-oxidation layer (141p in FIG. 18B) is formed, may be removed by a wet etching process.

Figure 20:
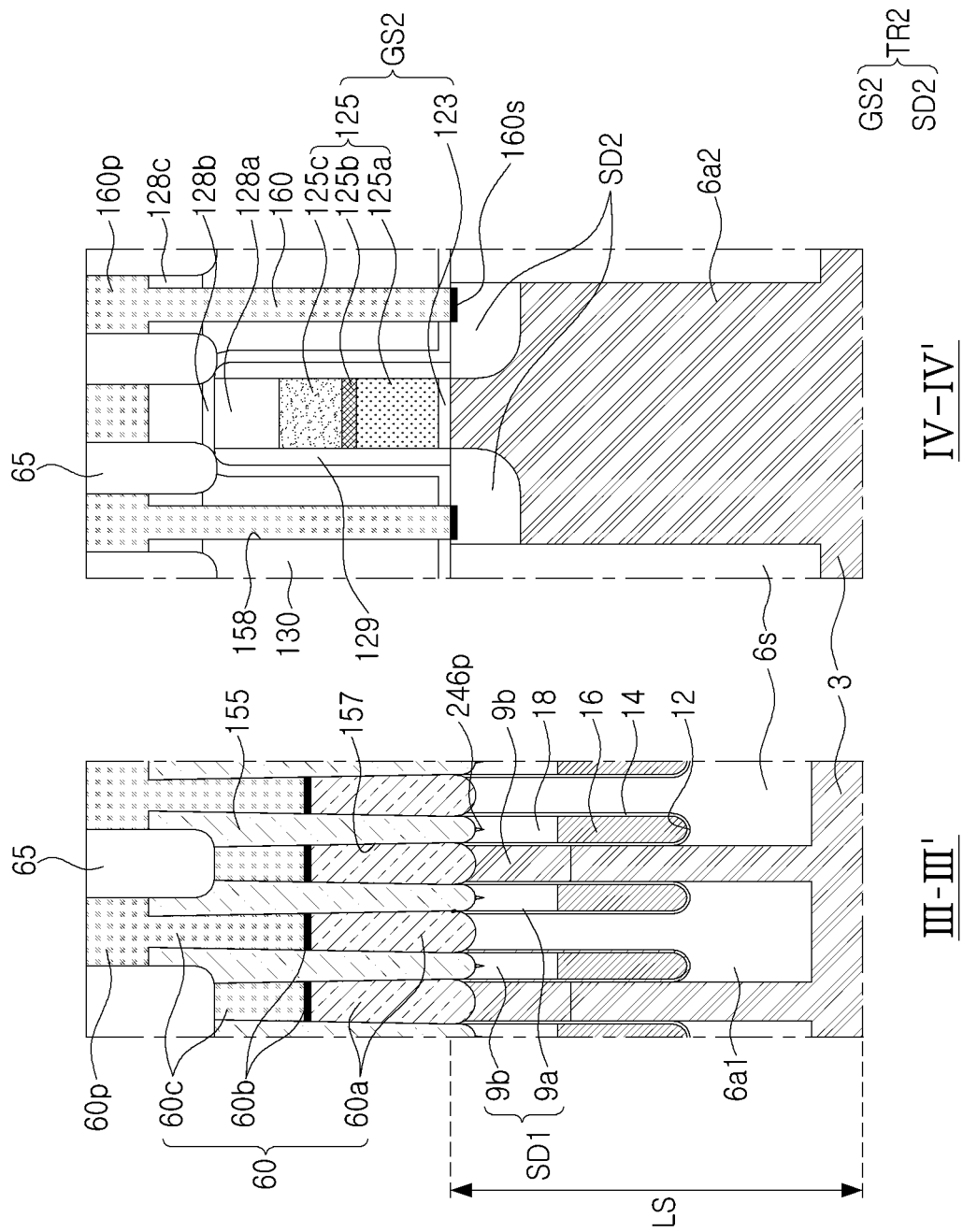

Referring to FIGS. 1B, 2, and 20, a method substantially the same as the method as described with reference to FIGS. 11A to 13B may then be performed. For example, operation S75 of removing the sacrificial layer 148 to form the fence holes 145 as described with reference to FIGS. 11A and 11B, operation S80 of forming the insulating fences 155 in the fence holes 145 as described with reference to FIGS. 12A and 12B, operation S85 of forming the first contact holes 157 as described with reference to FIGS. 13A and 13B, and operation S90 of forming the first contact plugs 60 in the first contact holes 157 may be performed.

Figure 13A:
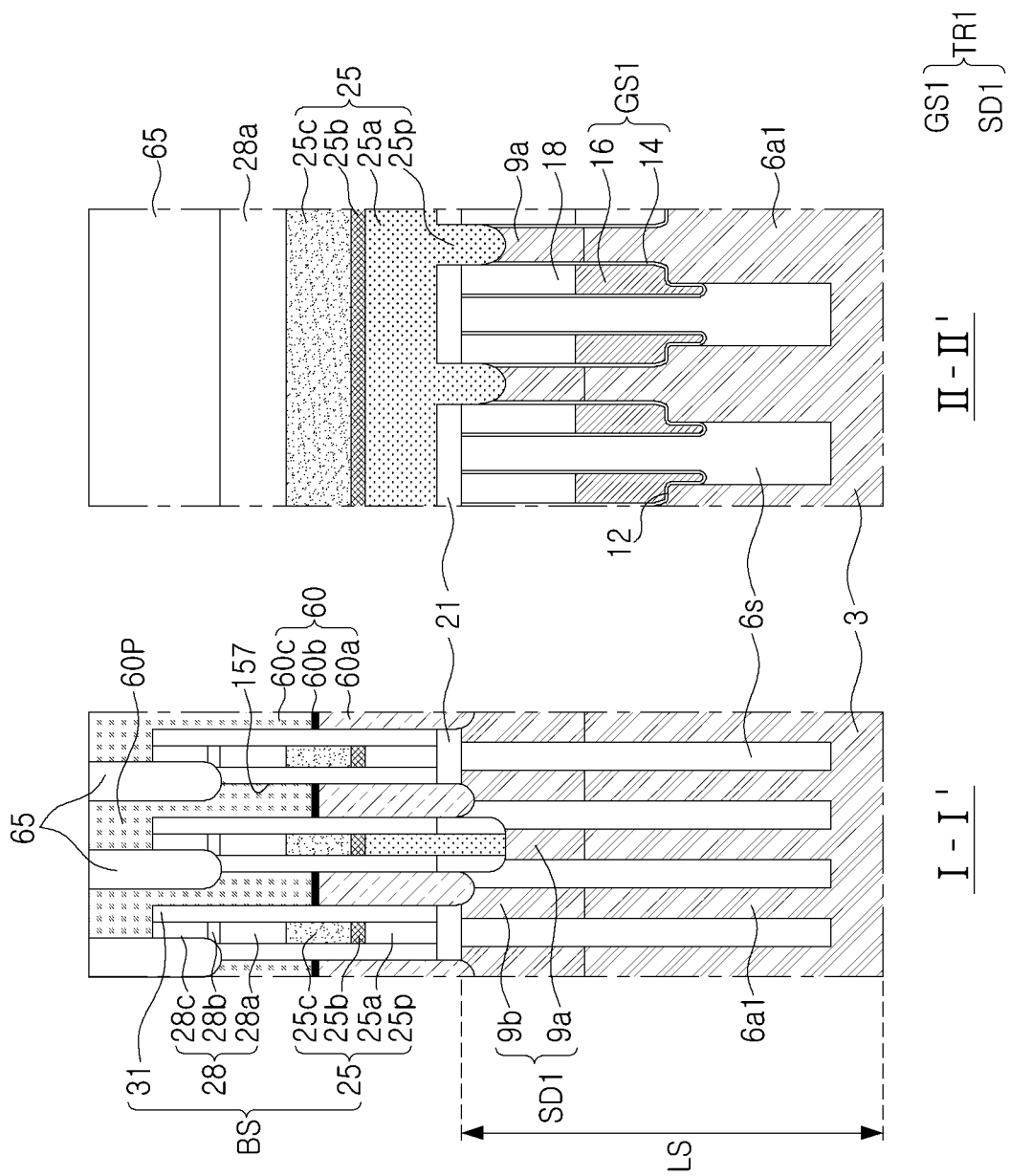
Figure 13B:
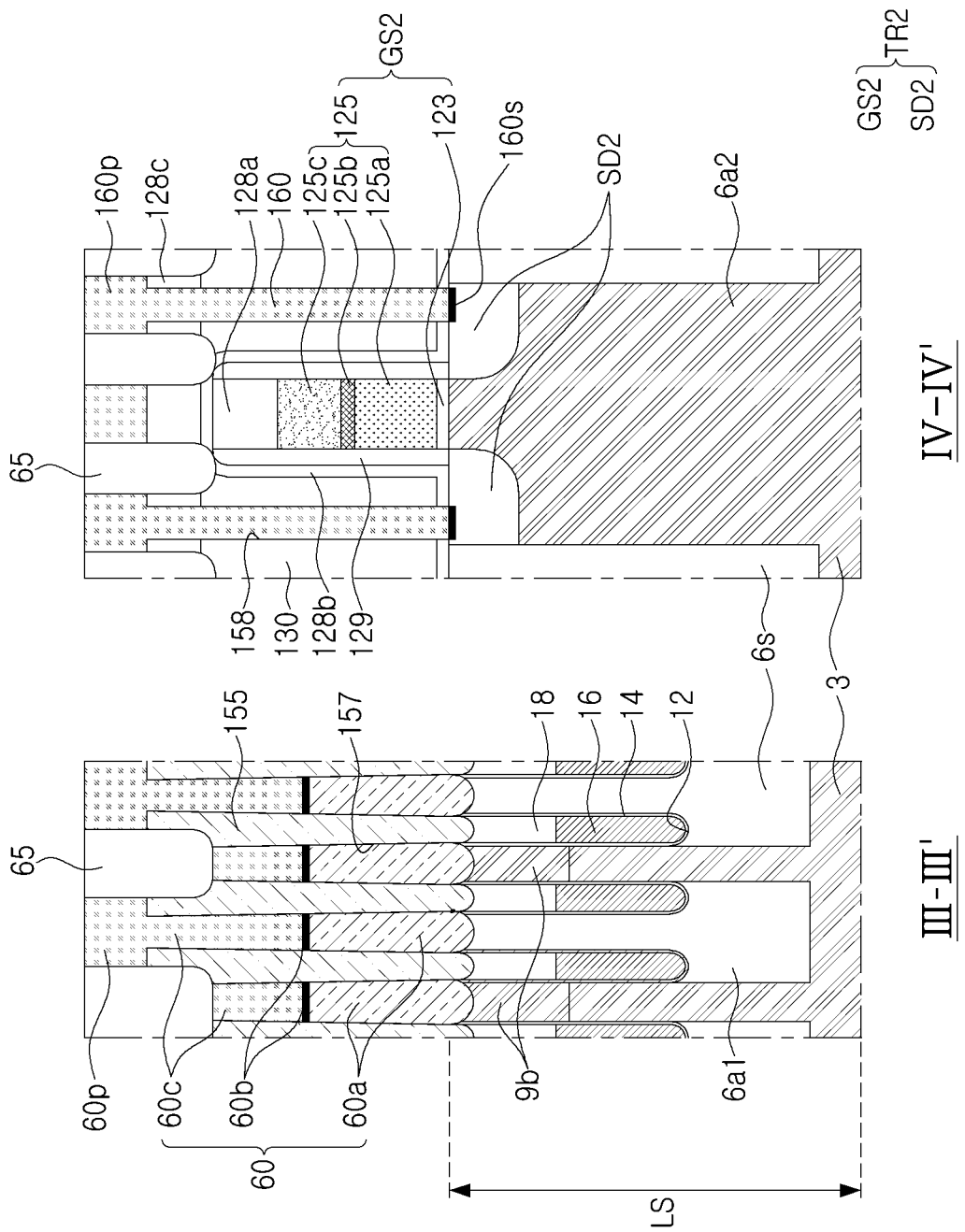

In an embodiment, the second contact plugs 160s and 160, the first and second pads 60p and 160p, and the separation insulating layer 65 as described with reference to FIGS. 13A and 13B may be formed.

In an embodiment, the protective patterns 246p as described with reference to FIG. 15B may remain below the insulating fences 155. Accordingly, the protective patterns 246p may be formed below the insulating fences 155 and may be formed in the gate capping layers 18.

Accordingly, the semiconductor device 1, fabricated by the method of fabricating a semiconductor device as described with reference to FIGS. 1B, 2, 14, and 15A to 20, may be provided.

Figure 21:
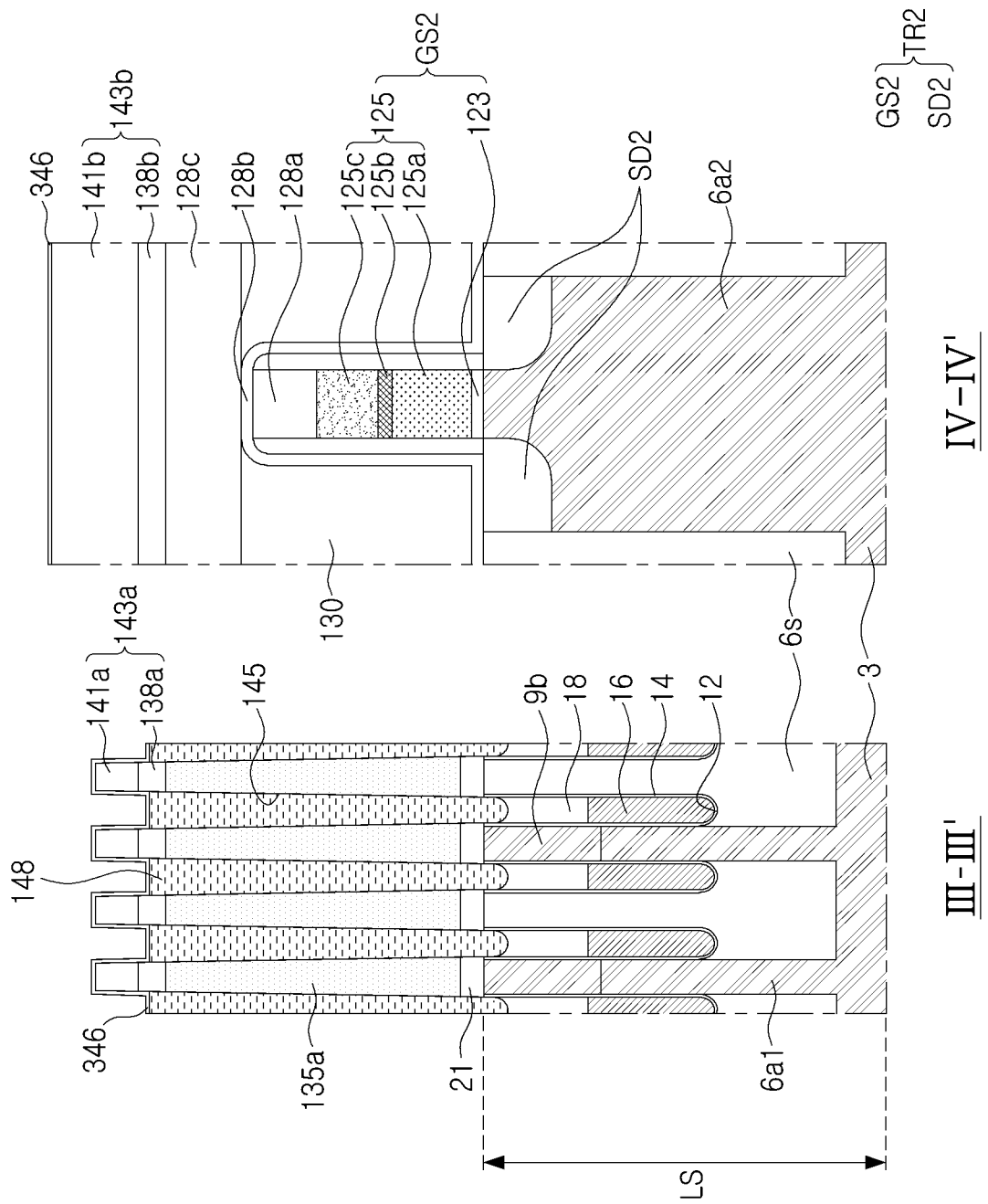
FIGS. 21 and 22 are cross-sectional views illustrating an example of a method of fabricating a semiconductor device according to an example embodiment.
Figure 22:
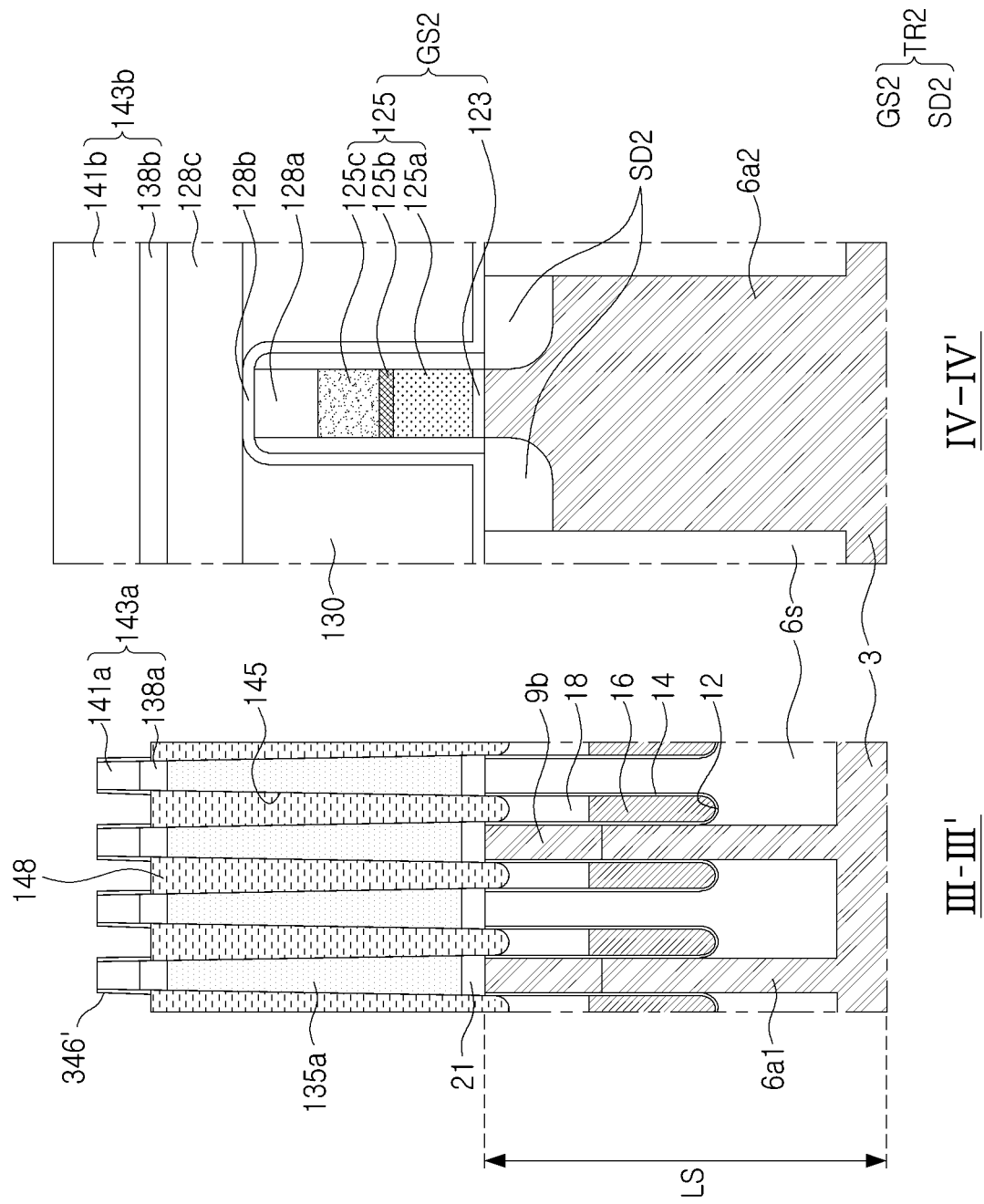

Next, a modified example of the method of fabricating a semiconductor device according to an example embodiment will be described with reference to FIGS. 21 and 22. FIGS. 21 and 22 are cross-sectional views illustrating regions taken along lines and IV-IV' of FIG. 2.

Figure 15A:
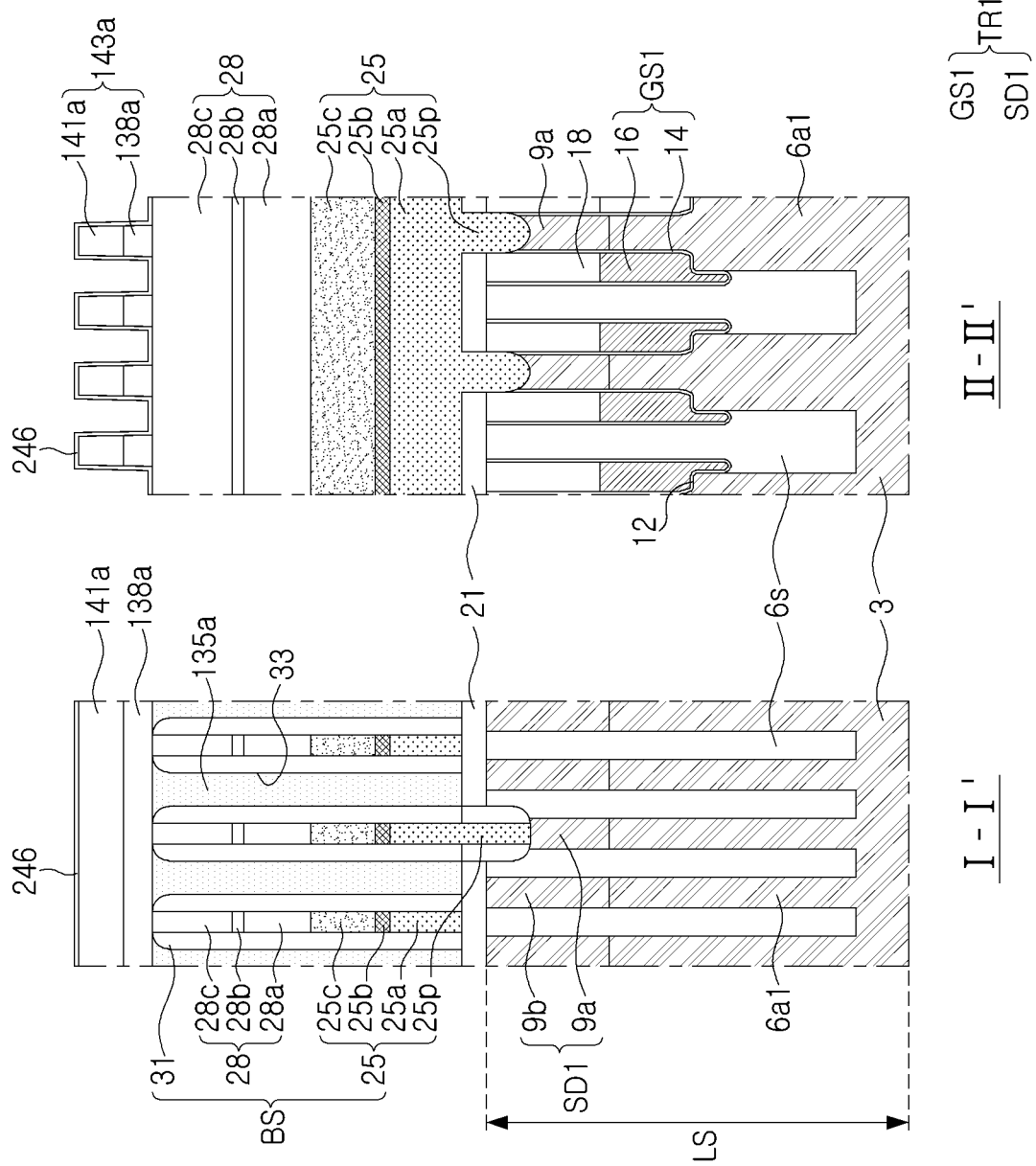
FIGS. 15A, 15B, 16A, 16B, 17A, 17B, 18A, 18B, 19, and 20 are cross-sectional views illustrating another example of a method of fabricating a semiconductor device according to an example embodiment.
Figure 15B:
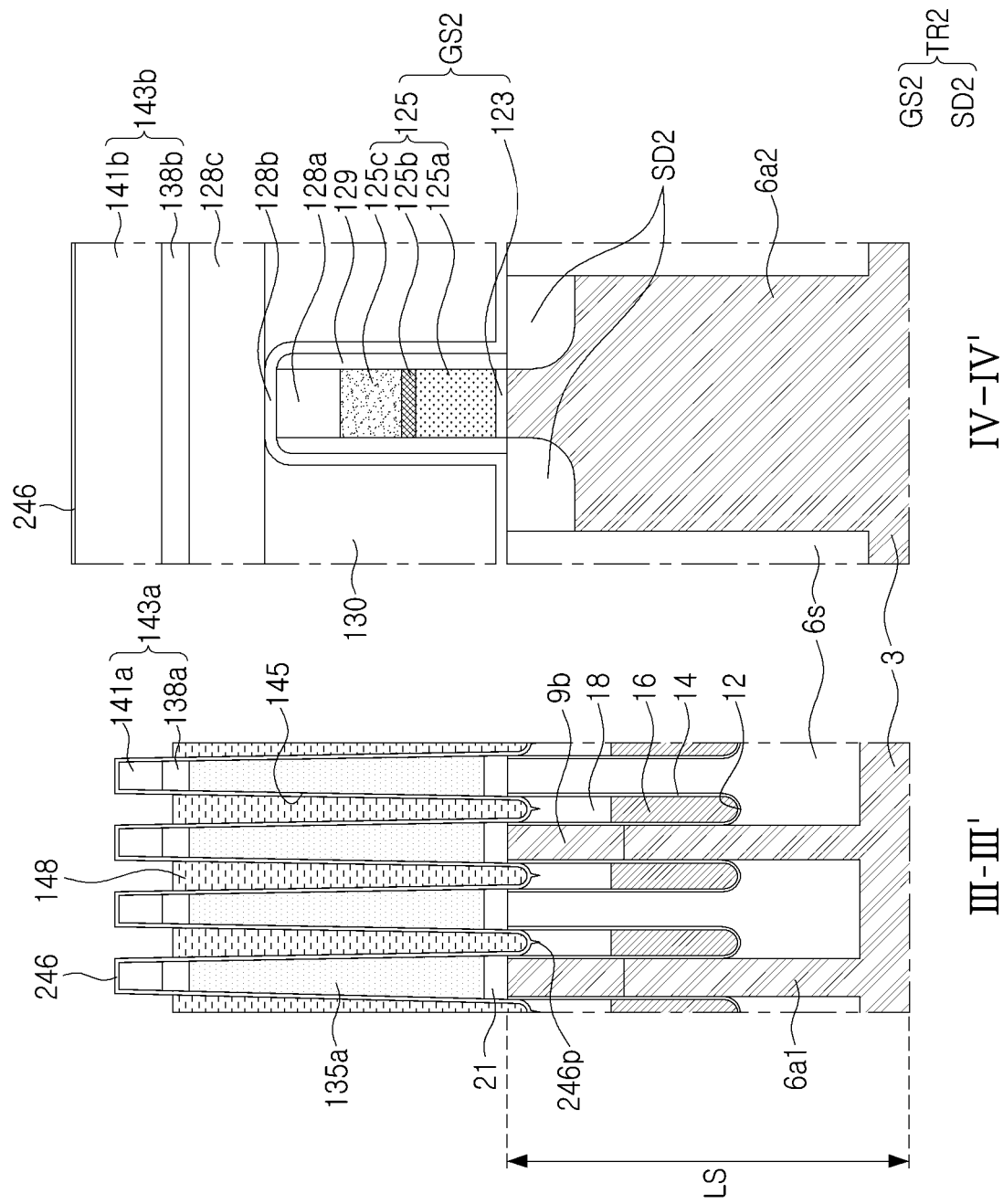

Referring to FIG. 21 together with FIG. 2, the protective layer described in FIGS. 15A and 15B (246 in FIGS. 15A and 15B) may be replaced with a protective layer 346 conformally formed after forming the sacrificial layers (148 of FIGS. 7A and 7B) as described in FIGS. 7A and 7B. The protective layer 346 may be formed of substantially the same material and have the same thickness as the protective layer (246 of FIGS. 15A and 15B) as described with reference to FIGS. 15A and 15B.

Figure 16A:
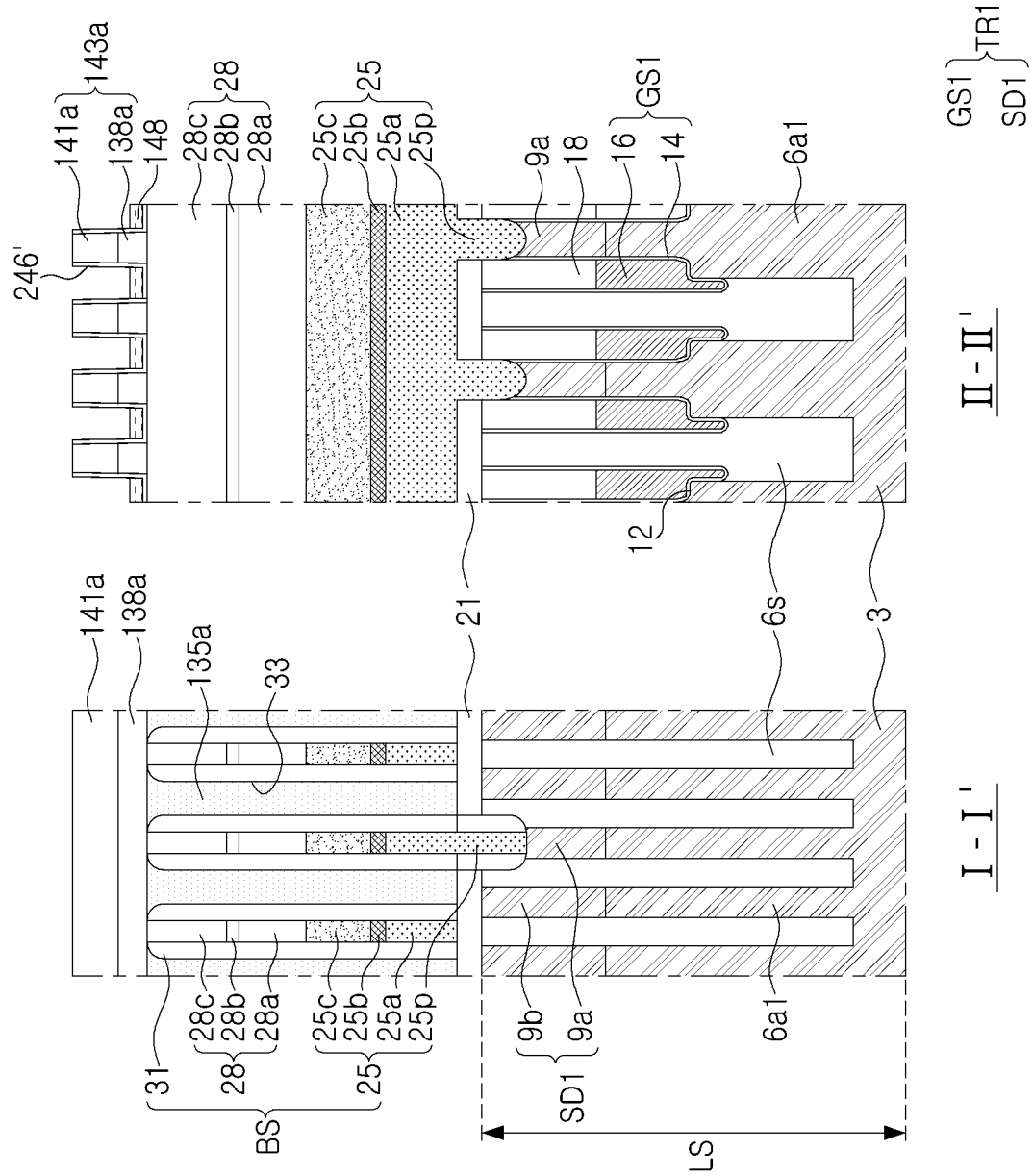
Figure 16B:
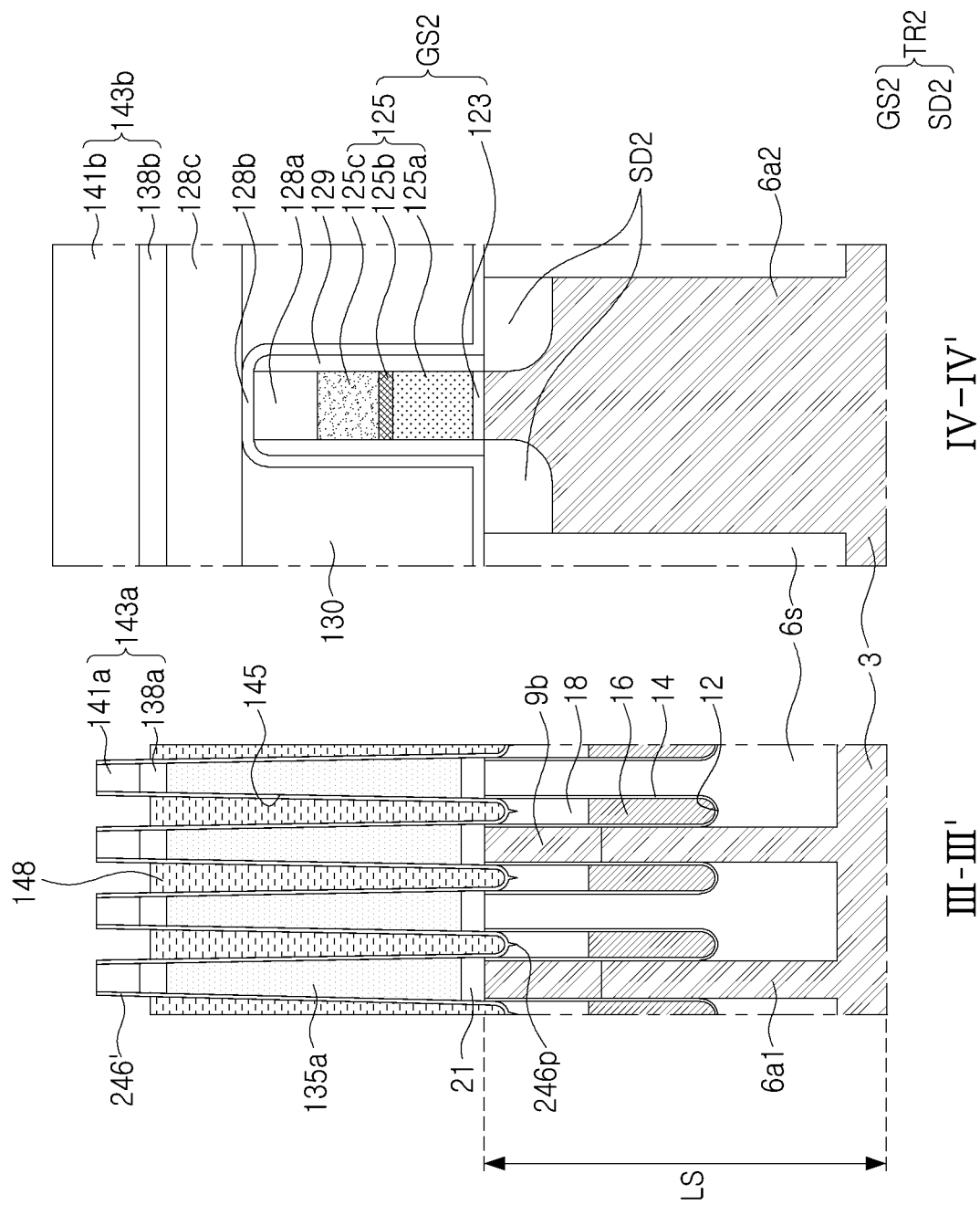
Figure 17A:
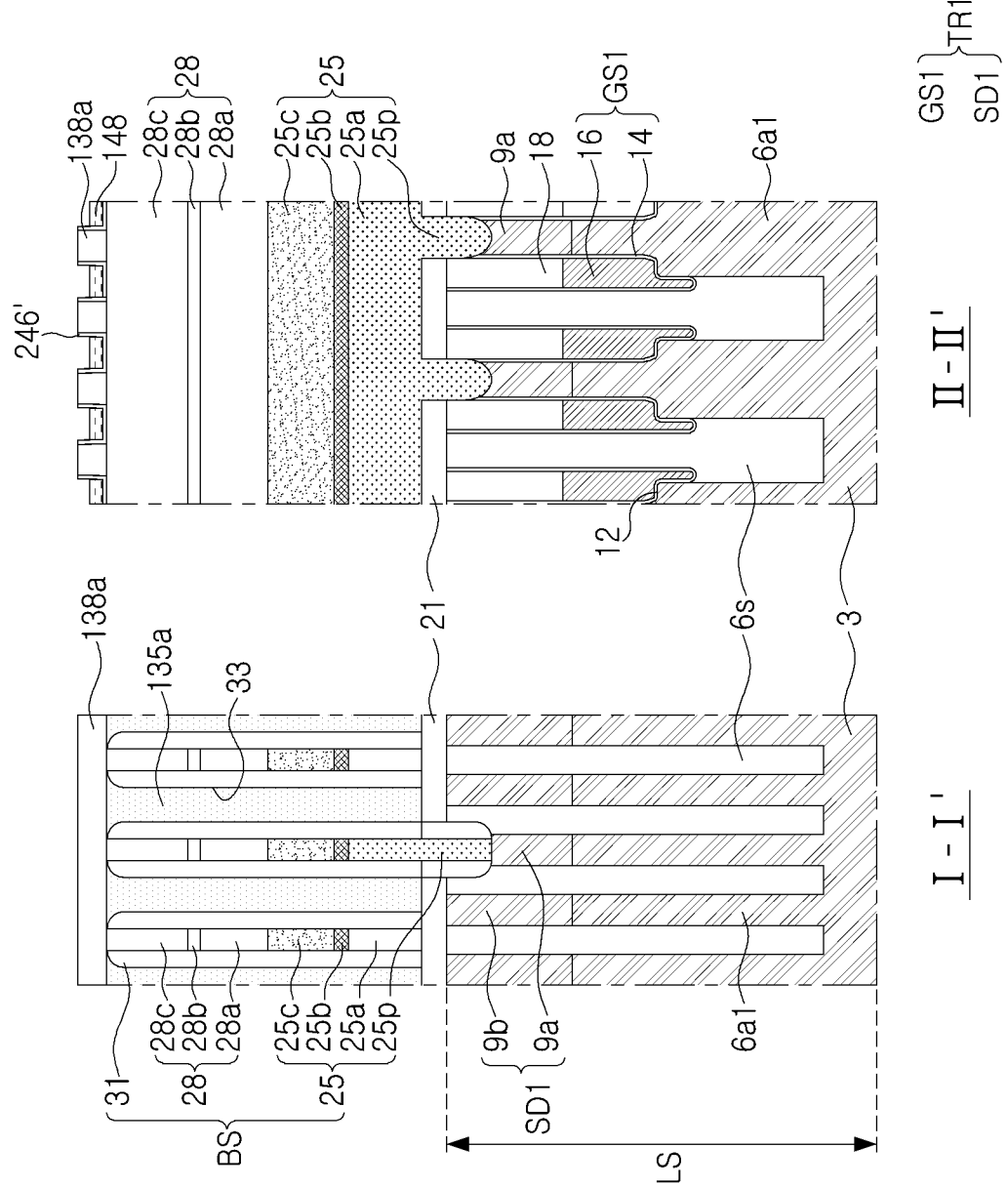
Figure 17B:
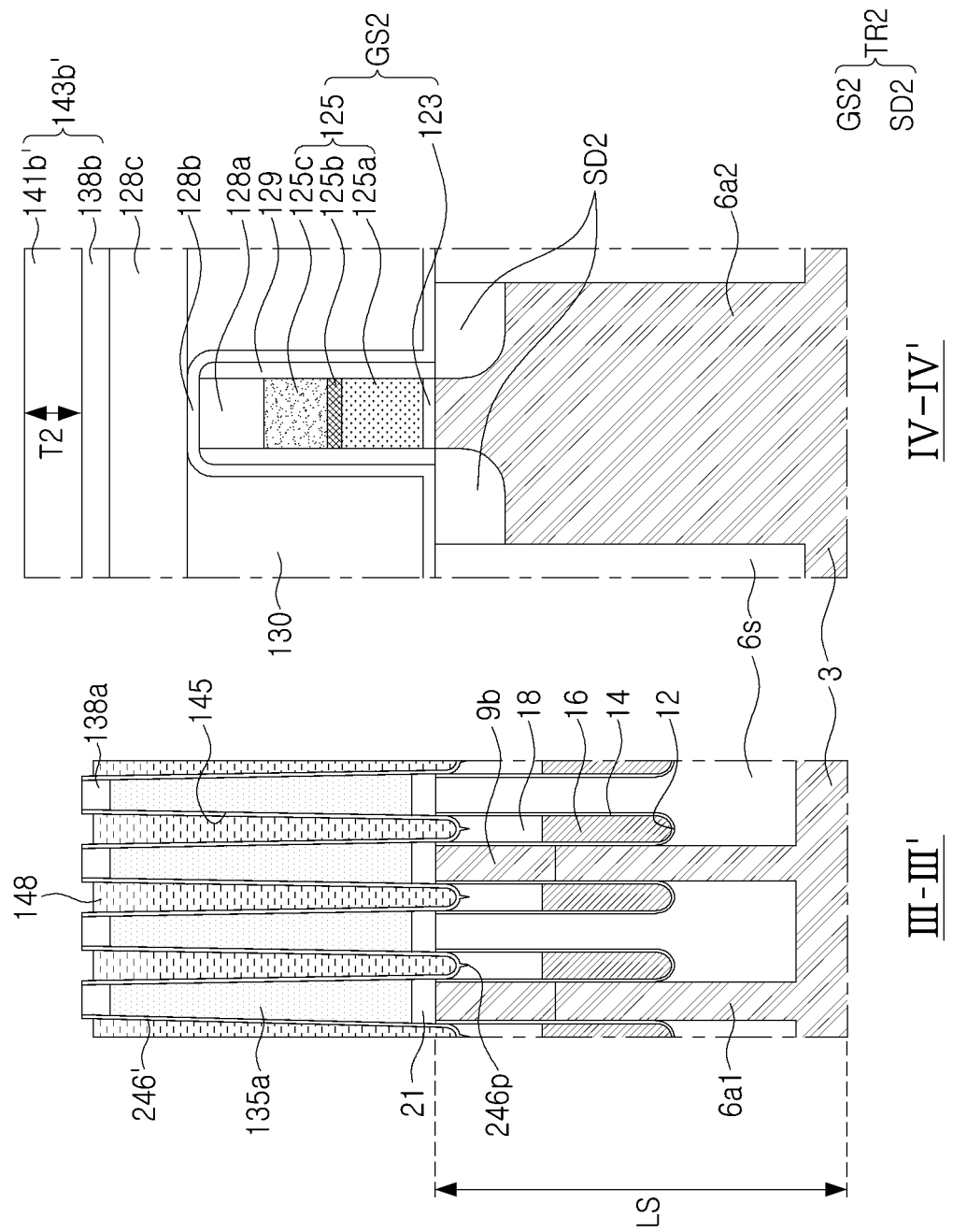
Figure 18A:
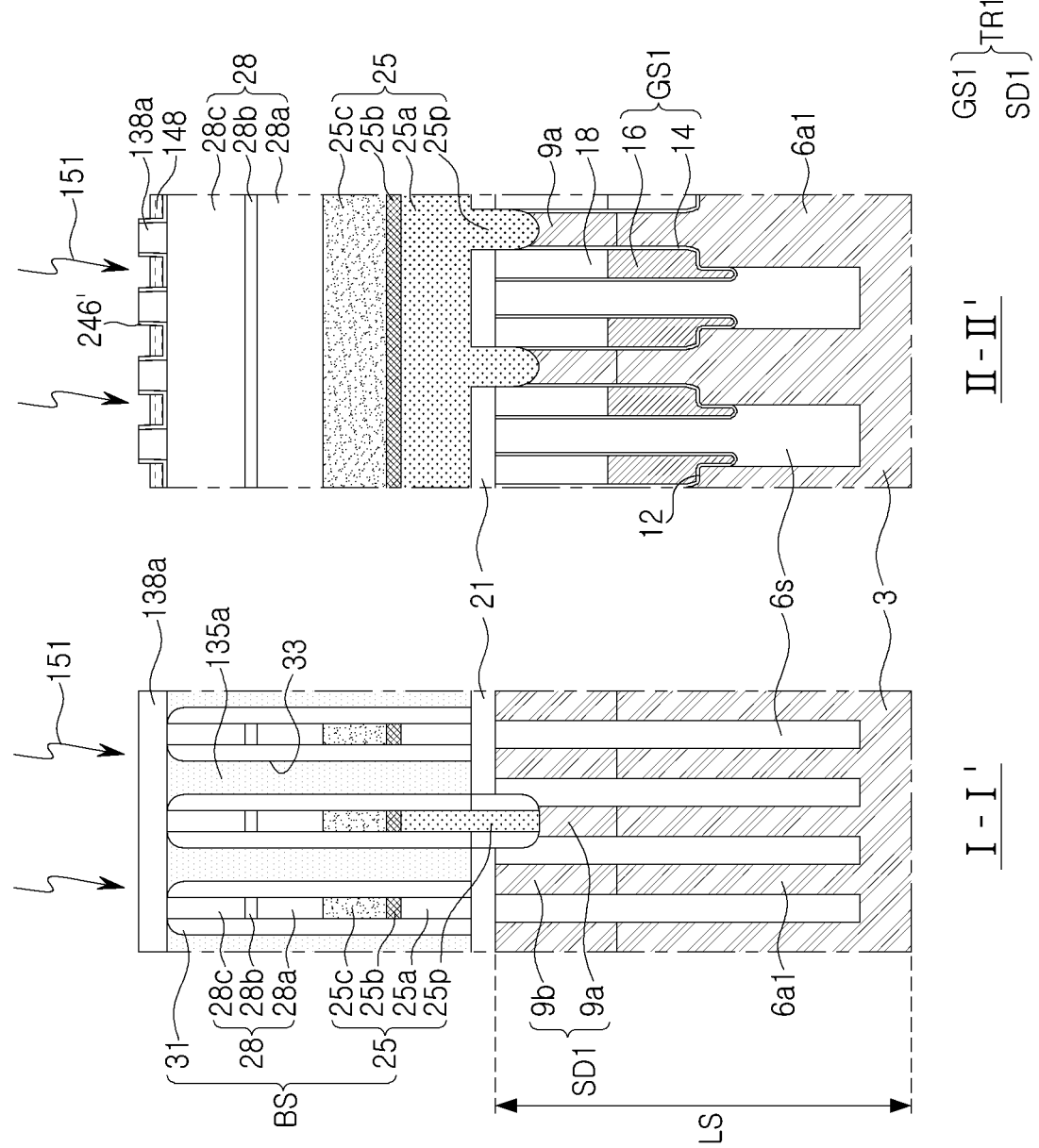
Figure 18B:
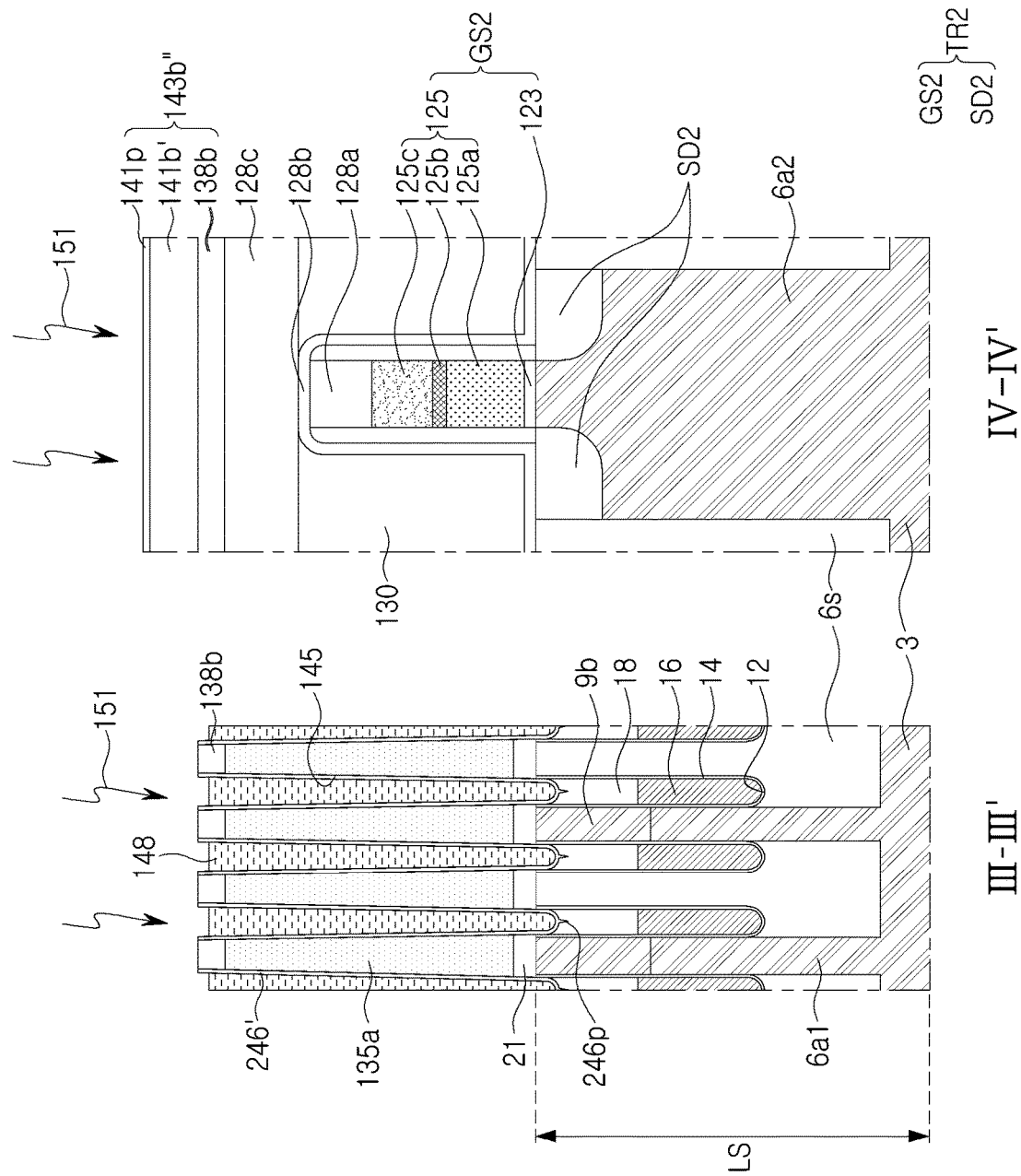

Referring to FIG. 22 together with FIG. 2, similarly to the description provided with reference to FIGS. 16A and 16B, in operation S55 of removing the second mask pattern 141a by the dry etching process in the process chamber described with reference to FIGS. 7A and 7B, a first etching process may be performed to remove the protective layer (346 of FIG. 21) disposed on upper surfaces of at least the second mask pattern 141a and the second mask layer 141b, instead of a native oxide layer which may be formed on the surface of the second mask pattern 141a. In the protective layer 346 of FIG. 21, a remaining passivation layer 346' may cover at least a portion of a side surface of the first mask pattern 138a. Then, the same method as described with reference to FIGS. 17A to 20 may be performed.

Accordingly, the semiconductor device 1 fabricated by the method of fabricating a semiconductor device, including the method in FIGS. 21 and 22, may be provided.

In modified embodiments, the protective layer (246 of FIGS. 15A and 15B, or 346 of FIG. 21) may protect a side surface of the first mask pattern 138a to prevent deformation of the first mask pattern 138a. Accordingly, the deformation of the first mask pattern 138a may be prevented, and the insulating patterns 135a may be formed without damage or defects. Accordingly, the insulating fences 155 formed between the insulating patterns 135a may be stably formed without deformation or defects, and the first contact plugs 60 formed between the insulating fences 155 may be formed without defects. As a result, the first contact plugs 60 may be stably and reliably formed.

As described above, the method of fabricating a semiconductor device according to example embodiments may include forming the insulating layer 135 in the first region MA and the peripheral structure TR2, 130, 128a, 128b, 128c, and 129 in the second region PA, sequentially forming the first mask layer 138 and the second mask layer 141 on the insulating layer 135 and the peripheral device structure TR2, 130, 128a, 128b, 128c, and 129, patterning the first and second mask layers 138 and 141 to form the first mask pattern 138a and the second mask pattern 141a sequentially stacked in the first region MA as well as to allow the first and second mask layers 138b and 141b to remain in the second region PA, etching the insulating layer 134 by an etching process using the mask structure 143a and 143b, including the first and second mask patterns 138a and 141a and the first and second mask layers 138b and 141b, as an etching mask to form the insulating pattern 135a in the opening 145, removing the second mask pattern 141a in the first region MA by performing a dry etching process, forming an anti-oxidation layer 141p on the surface of the second mask layer 141b' in the second region PA after removing the second mask pattern 141a in the first region MA, and removing the second mask layer 141b' having a surface, on which the anti-oxidation layer 141p is formed, by performing the wet etching process. Then, the sacrificial layer 148 may be removed to form the fence holes 145, insulating fences 155 may be formed in the fence holes 145, and the first mask pattern 138a and the insulating pattern 135a may be removed to form a contact hole 157, and the contact plug 60 may be formed in the contact hole 157.

As set forth above, according to embodiments, a method of fabricating a semiconductor device, including a method of stably patterning material layer using at least two mask layers, may be provided. A contact plug may be reliably formed without defects using the method of stably patterning the material layer.

While example embodiments have been shown and described above, it will be apparent to those skilled in the art that modifications and variations could be made without departing from the scope of the present inventive concept as defined by the appended claims.

What is claimed is:

1. A method of fabricating a semiconductor device, the method comprising:
   forming a plurality of bitline structures on a first region of a substrate;
   forming a peripheral device structure on a second region, adjacent to the first region, of the substrate;
   forming an insulating layer in spaces between two adjacent bitline structures of the plurality of bitline structures;
   forming a first mask layer and a second mask layer sequentially on the insulating layer, the plurality of bitline structures, and the peripheral device structure;
   patterning the first and second mask layers to form a first mask structure including a first mask pattern and a second mask pattern sequentially stacked on the first region, and a second mask structure including the first and second mask layers remaining, after the patterning of the first and second mask layers, on the second region;
   etching the insulating layer by an etching process using the first and second mask structures as an etching mask, to form a plurality of insulating patterns in spaces between two adjacent bitline structures of the plurality of bitline structures;
   forming a sacrificial layer to fill spaces between two adjacent insulating patterns of the plurality of insulating patterns on the first region;
   removing the second mask pattern on the first region by performing a dry etching process;
   forming an anti-oxidation layer on a surface of the second mask layer on the second region after removing the second mask pattern on the first region;
   removing the second mask layer, having the surface on which the anti-oxidation layer is formed, by performing a wet etching process;
   removing the sacrificial layer to form a plurality of fence holes after selectively removing the second mask layer on which the anti-oxidation layer is formed;
   forming a plurality of insulating fences in the plurality of fence holes, respectively;
   removing the first mask pattern and the plurality of insulating patterns to form a plurality of contact holes; and
   forming a plurality of contact plugs in the plurality of contact holes, respectively.

2. The method of claim 1, wherein:
the second mask layer is formed of polysilicon; and
the forming of the anti-oxidation layer on the surface of the second mask layer on the second region comprises performing a hydrogen plasma treatment process on the surface of the second mask layer.

3. The method of claim 2,
wherein the anti-oxidation layer is formed by terminating dangling bonds of the polysilicon of the second mask layer with hydrogen elements supplied by the hydrogen plasma treatment process.

4. The method of claim 1, wherein:
the plurality of insulating patterns is formed of silicon oxide; and
the plurality of insulating fences are formed of silicon nitride.

5. The method of claim 1,
wherein a thickness of the second mask pattern on the first region is smaller than a thickness of the second mask layer remaining on the second region after the forming of the plurality of insulating patterns.

6. The method of claim 1,
wherein the sacrificial layer, filling the spaces between the two adjacent insulating patterns of the plurality of insulating patterns, exposes at least a portion of a side surface of the second mask pattern.

7. The method of claim 1,
wherein a height of the second mask layer on the second region is reduced during a time when the second mask pattern on the first region is removed by performing the dry etching process.

8. The method of claim 1,
wherein the first mask layer on the second region is removed during a time when the plurality of contact holes are formed or after the plurality of contact holes are formed.

9. The method of claim 1, further comprising:
forming a liner layer to cover a side surface of the first mask pattern before forming the sacrificial layer.

10. The method of claim 9, wherein:
the liner layer covers internal walls of the spaces between the two adjacent insulating patterns of the plurality of insulating patterns; and
at least a portion of the liner layer remains in a lower portion of each insulating fence of the plurality of insulating fences after forming the plurality of contact plugs.

11. The method of claim 1, further comprising:
forming a liner layer to cover a side surface of at least the first mask pattern after forming the sacrificial layer.

12. A method of fabricating a semiconductor device, the method comprising:
forming an insulating layer on a first region of a substrate and a peripheral structure on a second region of the substrate;
forming a first mask layer and a second mask layer sequentially on the insulating layer and the peripheral structure;
patterning the first and second mask layers to form a first mask structure including a first mask pattern and a second mask pattern sequentially stacked on the first region, and a second mask structure including the first and second mask layers remaining, after the patterning of the first and second mask layers, on the second region;
etching the insulating layer by an etching process using the first and second mask structures as an etching mask, to form a plurality of insulating patterns separated apart from each other;
forming a sacrificial layer in spaces between two adjacent insulating patterns of the plurality of insulating patterns, on the first region;
removing the second mask pattern on the first region by performing a dry etching process;
forming an anti-oxidation layer on a surface of the second mask layer on the second region after removing the second mask pattern on the first region; and
removing the second mask layer, having the surface on which the anti-oxidation layer is formed, by performing a wet etching process.

13. The method of claim 12, further comprising:
removing the sacrificial layer to form a plurality of fence holes after selectively removing the second mask layer on which the anti-oxidation layer is formed;
forming a plurality of insulating fences in the plurality of fence holes, respectively;
removing the first mask pattern and the plurality of insulating patterns to form a plurality of contact holes; and
forming a plurality of contact plugs in the plurality of contact holes, respectively.

14. The method of claim 12, further comprising:
loading the substrate into a process chamber after forming the sacrificial layer,
wherein the removing the second mask pattern on the first region by performing the dry etching process is performed in the process chamber, and
wherein the forming the anti-oxidation layer on the surface of the second mask layer on the second region after removing the second mask pattern on the first region is performed in the process chamber; and
unloading the substrate, after forming the anti-oxidation layer on the surface of the second mask layer, from the process chamber.

15. The method of claim 14, wherein:
the second mask layer is formed of polysilicon; and
the forming the anti-oxidation layer on the surface of the second mask layer on the second region comprises performing a hydrogen plasma treatment process on the surface of the second mask layer in the process chamber.

16. The method of claim 15, wherein:
wherein the anti-oxidation layer is formed by terminating dangling bonds of silicon elements of the polysilicon of the second mask layer with hydrogen elements supplied by the hydrogen plasma treatment process.

17. The method of claim 13, wherein:
the plurality of insulating patterns are formed of silicon oxide; and
the plurality of insulating fences are formed of silicon nitride.

18. A method of fabricating a semiconductor device, the method comprising:
forming a cell transistor at a first region of a substrate;
forming a plurality of bitline structures and a peripheral device structure on the substrate, wherein the plurality of bitline structures are formed on the first region and the peripheral device structure is formed on a second region, adjacent to the first region, of the substrate;
forming an insulating layer between spaces between two adjacent bitline structures of the plurality of bitline structures;
forming a first mask layer and a second mask layer sequentially on the insulating layer, the plurality of bitline structures, and the peripheral device structure;
patterning the first and second mask layers to form a first mask structure including a first mask pattern and a second mask pattern sequentially stacked on the first region, and a second mask structure including the first and second mask layers remaining, after the patterning of the first and second mask layers, on the second region;
etching the insulating layer by an etching process, using the first and second mask structures as an etching mask, to form a plurality of insulating patterns,
wherein each of the plurality of insulating patterns is disposed between corresponding two adjacent bitline structures of the plurality of bitline structures;
forming a sacrificial layer to fill spaces between two adjacent insulating patterns of the plurality of insulating patterns, on the first region;
removing the second mask pattern by performing a dry etching process;
forming an anti-oxidation layer on a surface of the second mask layer on the second region after removing the second mask pattern; and
removing the second mask layer, having the surface on which the anti-oxidation layer is formed, by performing a wet etching process.

19. The method of claim 18, further comprising:
removing the sacrificial layer to form a plurality of fence holes after selectively removing the second mask layer on which the anti-oxidation layer is formed;

forming a plurality of insulating fences in the plurality of fence holes, respectively;

removing the first mask pattern and the plurality of insulating patterns to form a plurality of contact holes; and forming a plurality of contact plugs in the plurality of contact holes, respectively, wherein each bitline structure of the plurality of bitline structures comprises a bitline, and wherein the cell transistor comprises a wordline.

20. The method of claim 18, further comprising:

loading the substrate with the sacrificial layer into a process chamber after forming the sacrificial layer to fill the spaces between the two adjacent insulating patterns of the plurality of insulating patterns on the first region, wherein the removing the second mask pattern by performing the dry etching process is performed in the process chamber, and wherein the forming the anti-oxidation layer on the surface of the second mask layer on the second region after removing the second mask pattern is performed in the process chamber; and unloading the substrate with the anti-oxidation layer, after forming the anti-oxidation layer on the surface of the second mask layer, from the process chamber.

* * * * *